US012805153B2

(12) United States Patent
Lee et al.

(10) Patent No.: US 12,805,153 B2
(45) Date of Patent: Nov. 17, 2026

(54) DISPLAY APPARATUS AND METHOD OF MANUFACTURING THE SAME

(71) Applicant: Samsung Display Co., Ltd., Yongin-Si (KR)

(72) Inventors: Juhyun Lee, Yongin-si (KR); Gyungmin Baek, Yongin-si (KR); Hyuneok Shin, Yongin-si (KR); Shinil Choi, Yongin-si (KR)

(73) Assignee: Samsung Display Co., Ltd., Yongin-si (KR)

(*) Notice: Subject to any disclaimer, the term of this patent is extended or adjusted under 35 U.S.C. 154(b) by 1116 days.

(21) Appl. No.: 17/739,776

(22) Filed: May 9, 2022

(65) Prior Publication Data

US 2022/0416196 A1 Dec. 29, 2022

(30) Foreign Application Priority Data

Jun. 23, 2021 (KR) ........................ 10-2021-0081662

(51) Int. Cl.
*H10K 59/80* (2023.01)
*H10K 59/122* (2023.01)
*H10K 59/12* (2023.01)
*H10K 102/10* (2023.01)

(52) U.S. Cl.
CPC ..... *H10K 59/80518* (2023.02); *H10K 59/122* (2023.02); *H10K 59/1201* (2023.02); *H10K 2102/101* (2023.02)

(58) Field of Classification Search
None
See application file for complete search history.

(56) References Cited

U.S. PATENT DOCUMENTS 9,099,673 B2 8/2015 Tchakarov et al.
9,564,609 B2 2/2017 Sasaki et al.
2003/0057462 A1* 3/2003 An ........................ H10D 1/682 257/295
2006/0060865 A1* 3/2006 Cho ..................... H10K 59/122 257/E21.271
2010/0053759 A1* 3/2010 Inoue ....................... C09D 7/61 359/601
2010/0225227 A1 9/2010 Tchakarov et al.
2012/0205701 A1* 8/2012 Sasaki .................. H10K 50/818 257/98

(Continued)

FOREIGN PATENT DOCUMENTS

KR 10-0645691 B1 11/2006
KR 1020090091175 A 8/2009

(Continued)

*Primary Examiner* — Bradley Smith
(74) *Attorney, Agent, or Firm* — Innovation Counsel LLP

(57) ABSTRACT

For a display apparatus with a reduced defect rate and a method of manufacturing the display apparatus, the display apparatus includes: a pixel electrode; an opposite electrode disposed on the pixel electrode; and an intermediate layer disposed between the pixel electrode and the opposite electrode, wherein the pixel electrode includes: a reflective layer including a first metal; a transparent layer disposed on the reflective layer; and a first barrier layer disposed between the reflective layer and the transparent layer. The first barrier layer includes an oxide of a second metal different from the first metal.

5 Claims, 26 Drawing Sheets

(56) References Cited

U.S. PATENT DOCUMENTS

| | | | | |
|---|---|---|---|---|
| 2016/0190222 | A1* | 6/2016 | Chen | H10K 71/00 438/23 |
| 2017/0066168 | A1* | 3/2017 | Ludwig | B29C 45/14655 |
| 2019/0305227 | A1 | 10/2019 | Yoon et al. | |
| 2021/0028236 | A1 | 1/2021 | Kim et al. | |

FOREIGN PATENT DOCUMENTS

| | | | |
|---|---|---|---|
| KR | 1020120092519 | A | 8/2012 |
| KR | 10-1796934 | B1 | 12/2017 |
| KR | 10-2020-0095429 | B1 | 8/2020 |

* cited by examiner

DISPLAY APPARATUS AND METHOD OF MANUFACTURING THE SAME

CROSS-REFERENCE TO RELATED APPLICATION

This application is based on and claims priority under 35 U.S.C. § 119 to Korean Patent Application No. 10-2021-0081662, filed on Jun. 23, 2021, in the Korean Intellectual Property Office, the disclosure of which is incorporated by reference herein in its entirety.

BACKGROUND

1. Field

One or more embodiments relate to a display apparatus and a method of manufacturing the same, and more particularly, to a display apparatus with a reduced defect rate and a method of manufacturing the same.

2. Description of the Related Art

A display apparatus is an apparatus for providing a user with visual information such as images. With the development of various electronic apparatuses such as large-scale televisions (TVs), various kinds of display apparatuses applicable thereto are under development. Recently, mobile electronic apparatuses have been widely used. As mobile electronic apparatuses, not only miniaturized electronic apparatuses such as mobile phones but also tablet personal computers (PC) have been widely used recently.

A display apparatus includes a display area and a non-display area, and a plurality of light-emitting elements are arranged in the display area. A display apparatus may display images through light emitted from a plurality of light-emitting elements. The light-emitting elements may each include a pixel electrode and an opposite electrode.

SUMMARY

In the related art, metal flows out from a pixel electrode during a process of manufacturing a display apparatus and causes a defect in a light-emitting element.

One or more embodiments include a display apparatus with a reduced defect rate of a light-emitting element and a method of manufacturing the display apparatus. However, such a technical problem is an example, and the disclosure is not limited thereto.

Additional aspects will be set forth in part in the description which follows and, in part, will be apparent from the description, or may be learned by practice of the presented embodiments of the disclosure.

According to one or more embodiments, a display apparatus includes a pixel electrode, an opposite electrode disposed on the pixel electrode, and an intermediate layer disposed between the pixel electrode and the opposite electrode, wherein the pixel electrode includes a reflective layer including a first metal, a transparent layer disposed on the reflective layer, and a first barrier layer disposed between the reflective layer and the transparent layer. The first barrier layer includes an oxide of a second metal different from the first metal.

The first metal may include aluminum or an aluminum alloy.

The second metal may include titanium.

The transparent layer may include a transparent conductive oxide.

The reflective layer may have a thickness of about 500 Å to about 5000 Å.

The first barrier layer may have a thickness of about 5 Å to about 100 Å.

The pixel electrode may further include a second barrier layer disposed between the reflective layer and the first barrier layer. The second barrier layer may include the second metal.

The second metal may include titanium.

The sum of a thickness of the first barrier layer and a thickness of the second barrier layer may be in a range of about 5 Å to about 100 Å.

The display apparatus may further include a pixel-defining layer defining an opening that exposes at least a center portion of the pixel electrode.

The intermediate layer may include an organic emission layer.

The display apparatus may further include a color-converting light-transmitting layer disposed on the opposite electrode, wherein the intermediate layer may include an emission layer that emits light of a first color, and wherein the color-converting light-transmitting layer may include a light-transmitting layer that passes light of the first color therethrough, and a color-converting layer that converts the light of the first color into light of a second color having a wavelength band different from that of the light of the first color.

According to one or more embodiments, a method of manufacturing a display apparatus includes forming a pixel electrode over a substrate, forming an intermediate layer on the pixel electrode, and forming an opposite electrode covering the intermediate layer, wherein the forming of the pixel electrode includes forming a preliminary reflective layer including a first metal, forming a metal thin film on the preliminary reflective layer, the metal thin film including a second metal different from the first metal, forming a preliminary transparent layer on the metal thin film, patterning the preliminary reflective layer, the metal thin film, and the preliminary transparent layer, and forming a barrier layer by oxidizing at least a portion of the metal thin film.

The method may further include forming a preliminary pixel-defining layer on the preliminary transparent layer that is patterned, forming a pixel-defining layer by patterning the preliminary pixel-defining layer, and heat-treating the pixel-defining layer, wherein the forming of the barrier layer may include oxidizing at least a portion of the metal thin film through the heat-treating.

The first metal of the preliminary reflective layer may include aluminum or an aluminum alloy.

The second metal of the metal thin film may include titanium.

The reflective layer may have a thickness of about 500 Å to about 5000 Å.

The barrier layer may have a thickness of about 5 Å to about 100 Å.

According to one or more embodiments, a method of manufacturing a display apparatus includes forming a pixel electrode over a substrate, forming an intermediate layer on the pixel electrode, and forming an opposite electrode covering the intermediate layer, wherein the forming of the pixel electrode includes forming a preliminary reflective layer including a first metal, forming a preliminary barrier layer on the preliminary reflective layer through an reactive sputtering process, the preliminary barrier layer including an oxide of a second metal different from the first metal, forming a preliminary transparent layer on the preliminary barrier layer, and patterning the preliminary reflective layer, the preliminary barrier layer, and the preliminary transparent layer.

The first metal of the preliminary reflective layer may include aluminum or an aluminum alloy.

An oxide of the second metal of the preliminary barrier layer may include titanium oxide.

The reflective layer may have a thickness of about 500 Å to about 5000 Å.

The barrier layer may have a thickness of about 5 Å to about 100 Å.

These and/or other aspects will become apparent and more readily appreciated from the following description of the embodiments, the accompanying drawings, and claims.

These general and specific aspects may be implemented by using a system, a method, a computer program, or a combination of a certain system, method, and computer program.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
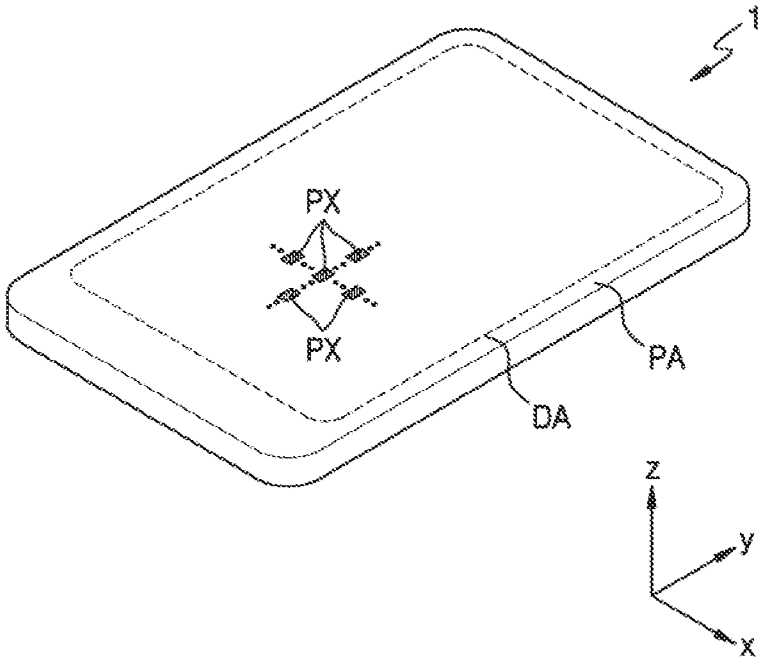
FIG. 1 is a plan view of a display apparatus according to an embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof.

As the present disclosure allows for various changes and numerous embodiments, certain embodiments will be illustrated in the drawings and described in the written description. Effects and features of the disclosure, and methods for achieving them will be clarified with reference to embodiments described below in detail with reference to the drawings. However, the disclosure is not limited to the following embodiments and may be embodied in various forms.

Hereinafter, embodiments will be described with reference to the accompanying drawings, wherein like reference numerals refer to like elements throughout and a repeated description thereof is omitted.

While such terms as "first" and "second" may be used to describe various components, such components must not be limited to the above terms. The above terms are used to distinguish one component from another.

The singular forms "a," "an," and "the" as used herein are intended to include the plural forms as well unless the context clearly indicates otherwise.

It will be understood that the terms "comprise," "comprising," "include" and/or "including" as used herein specify the presence of stated features or components but do not preclude the addition of one or more other features or components.

It will be further understood that, when a layer, region, or component is referred to as being "on" another layer, region, or component, it can be directly or indirectly on the other layer, region, or component. That is, for example, intervening layers, regions, or components may be present.

Sizes of elements in the drawings may be exaggerated or reduced for convenience of explanation. For example, since sizes and thicknesses of elements in the drawings are arbitrarily illustrated for convenience of explanation, the disclosure is not limited thereto.

When an embodiment may be implemented differently, a certain process order may be performed differently from the described order. For example, two consecutively described processes may be performed substantially at the same time or performed in an order opposite to the described order.

In the present specification, "A and/or B" means A or B, or A and B. In the present specification, "at least one of A and B" means A or B, or A and B.

It will be understood that when a layer, region, or component is referred to as being "connected" to another layer, region, or component, it may be "directly connected" to the other layer, region, or component or may be "indirectly connected" to the other layer, region, or component with other layer, region, or component interposed therebetween. For example, it will be understood that when a layer, region, or component is referred to as being "electrically connected" to another layer, region, or component, it may be "directly electrically connected" to the other layer, region, or component or may be "indirectly electrically connected" to other layer, region, or component with other layer, region, or component interposed therebetween.

The x-axis, the y-axis and the z-axis are not limited to three axes of the rectangular coordinate system, and may be interpreted in a broader sense. For example, the x-axis, the y-axis, and the z-axis may be perpendicular to one another, or may represent different directions that are not perpendicular to one another.

FIG. 1 is a plan view of a display apparatus 1 according to an embodiment.

Referring to FIG. 1, the display apparatus 1 may include a display area DA and a peripheral area PA disposed outside the display area DA. The display apparatus 1 may display images through an array of a plurality of pixels PX in the display area DA. A pixel PX may include an emission area through which a light-emitting element driven by a pixel circuit emits light. That is, images may be displayed by light emitted by a light-emitting element through a pixel PX. Light-emitting elements, pixel circuits and various kinds of signal lines and power lines which are connected to the pixel circuits may be arranged in the display area DA.

The peripheral area PA is a region in which images are not displayed and may surround the display area DA entirely or partially. Various lines, a driving circuit, and the like which is configured to provide electric signals or power to the display area DA may be arranged in the peripheral area PA.

The display apparatus 1 may have an approximately rectangular shape in a plan view. As an example, the display apparatus 1 may have a rectangular planar shape as a whole having short sides extending, for example, in an x-direction and long sides extending, for example, in a y-direction as shown in FIG. 1. A corner at which the short side meets the long side may have a right angle shape or have a round shape having a preset curvature as shown in FIG. 1. The planar shape of the display apparatus 1 is not limited to a rectangular shape and may have various shapes such as a polygon including a triangle and the like, a circular shape, an elliptical shape, an irregular shape, and the like.

Though FIG. 1 shows the display apparatus 1 having a flat display surface, the embodiment is not limited thereto. In another embodiment, the display apparatus 1 may include a three-dimensional display surface or a curved display surface. In the case where the display apparatus 1 includes a three-dimensional display surface, the display apparatus 1 may include a plurality of display areas facing different directions, for example, include a polygonal prism-shaped display surface. In another embodiment, in the case where the display apparatus 1 includes a curved display surface, the display apparatus 1 may be implemented as various types such as flexible, foldable, and rollable display apparatuses.

Hereinafter, for convenience of description, though the case where the display apparatus 1 is used in smartphones, the display apparatus 1 according to an embodiment is not limited thereto. The display apparatus 1 may be used as a display screen of various products including televisions, notebook computers, monitors, advertisement boards, Internet of things (IoT) as well as portable electronic apparatuses including mobile phones, smart phones, tablet personal computers (PC), mobile communication terminals, electronic organizers, electronic books, portable multimedia players (PMP), navigations, and ultra mobile personal computers (UMPC). In addition, the display apparatus 1 according to an embodiment may be used in wearable devices including smartwatches, watchphones, glasses-type displays, and head-mounted displays (HMD). In addition, the display apparatus 1 may be used as instrument panels for automobiles, center fascias for automobiles, or center information displays (CID) arranged on a dashboard, room mirror displays that replace side mirrors of automobiles, and displays arranged on the backside of front seats as an entertainment for back seats of automobiles.

In addition, though description is made below to the case where the display apparatus 1 include an organic light-emitting diode OLED as a light-emitting element, the display apparatus 1 according to an embodiment is not limited thereto. In another embodiment, the display apparatus 1 may be a light-emitting display apparatus including a light-emitting diode, that is, an inorganic light-emitting display apparatus. In another embodiment, the display apparatus 1 may be a quantum-dot light-emitting display apparatus.

Figure 2:
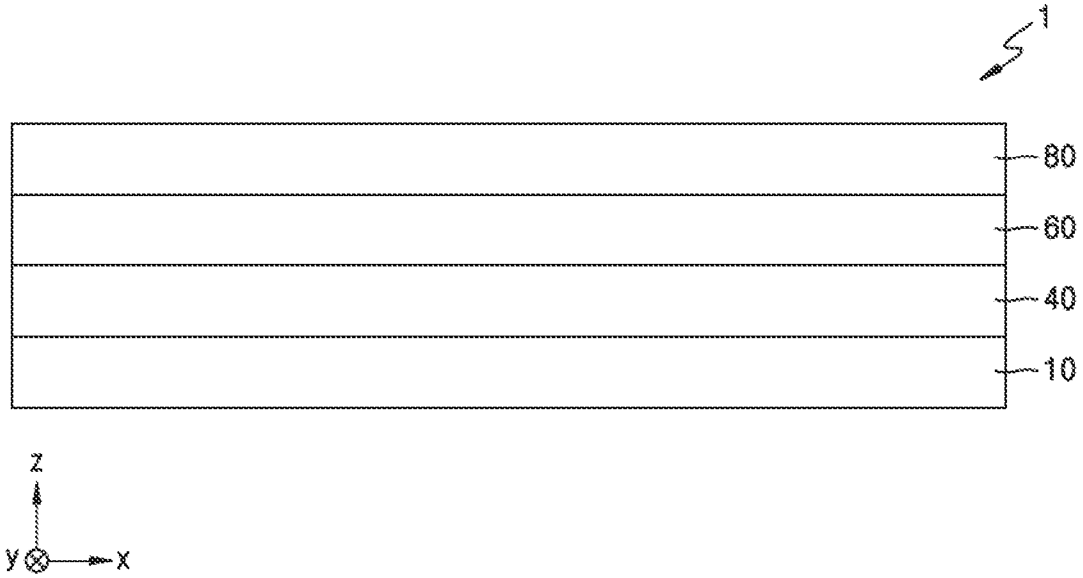
FIG. 2 is a cross-sectional view of a display apparatus according to an embodiment.

FIG. 2 is a cross-sectional view of the display apparatus 1 according to an embodiment.

Referring to FIG. 2, the display apparatus 1 may include a display panel 10, an input sensing layer 40, and an optical functional layer 60 disposed on the display panel 10. These layers may be covered by a cover window 80.

The display panel 10 may include a plurality of light-emitting elements and a plurality of pixel circuits electrically connected to the plurality of light-emitting elements, respectively. As described above, the display panel 10 may display images through light emitted from the light-emitting elements.

The input sensing layer 40 may obtain coordinate information corresponding to an external input, for example, a touch event. The input sensing layer 40 may include sensing electrodes (or touch electrodes) and trace lines electrically connected to the sensing electrodes. The input sensing layer 40 may be arranged on the display panel 10. The input sensing layer 40 may sense an external input by using a mutual capacitive method or a self-capacitive method.

The input sensing layer 40 may be directly formed on the display panel 10. Alternatively, the input sensing layer 40 may be separately formed and then coupled to the display panel 10 through an adhesive (not shown). For the adhesive, a general adhesive known in the art may be employed without limitation. The adhesive may be an optical clear adhesive (OCA). In an embodiment, as shown in FIG. 2, the input sensing layer 40 may be directly formed on the display panel 10. In this case, the adhesive may not be arranged between the input sensing layer 40 and the display panel 10.

The optical functional layer 60 may include an anti-reflection layer. The anti-reflection layer may reduce reflectivity of light (external light) incident toward the display panel 10 from the outside through the cover window 80. The anti-reflection layer may include a retarder and a polarizer. The retarder may include a film-type retarder or a liquid crystal-type retarder. The retarder may include a $\lambda/2$ retarder and/or a $\lambda/4$ retarder. The polarizer may include a film-type polarizer or a liquid crystal-type polarizer. The film-type polarizer may include a stretchable synthetic resin film, and the liquid crystal-type polarizer may include liquid crystals arranged in a predetermined arrangement. Each of the retarder and the polarizer may further include a protective film.

In another embodiment, the anti-reflection layer may include a black matrix and color filters. The color filters may be arranged by taking into account colors of light emitted respectively from the pixels of the display panel 10. In another embodiment, the anti-reflection layer may include a destructive interference structure. The destructive interference structure may include a first reflection layer and a second reflection layer respectively arranged on different layers. First-reflected light and second-reflected light respectively reflected by the first reflection layer and the second reflection layer may create destructive-interference and thus the reflectivity of external light may be reduced.

The optical functional layer 60 may include a lens layer. The lens layer may improve emission efficiency of light emitted from the display panel 10 or reduce color deviation. The lens layer may include a layer having a concave or convex lens shape and/or include a plurality of layers having different refractive indexes. The optical functional layer 60 may include both the anti-reflection layer and the lens layer, or include one of these layers.

An adhesive (not shown) may be arranged between the input sensing layer 40 and the optical functional layer 60. For the adhesive, a general adhesive known in the art may be employed without limitation. The adhesive may be an optical clear adhesive (OCA).

The cover window 80 may have a high transmittance to have light emitted from the display panel 10 pass therethrough and may have a thin thickness to reduce the weight of the display apparatus 1. In addition, the cover window 80 may have strong strength and hardness to protect the display panel 10 from an external impact and have an impact-resistance and a scratch-resistance.

An adhesive (not shown) may be arranged between the input sensing layer 40 and the optical functional layer 60, and between the optical functional layer 60 and the cover window 80. The cover window 80 may be coupled to an element therebelow, for example, the optical functional layer 60, through the adhesive. In an embodiment, the adhesive may be an optical clear adhesive (OCA).

Figure 3:
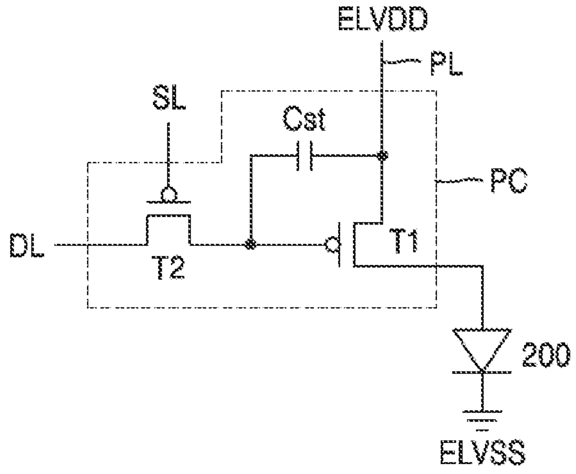
FIG. 3 is an equivalent circuit diagram of a pixel circuit of a display apparatus according to an embodiment.

FIG. 3 is an equivalent circuit diagram of a pixel circuit PC of the display apparatus 1 according to an embodiment.

Referring to FIG. 3, the pixel circuit PC may include a plurality of thin-film transistors and a storage capacitor, and be electrically connected to an organic light-emitting diode OLED. In an embodiment, the pixel circuit PC may include a driving thin-film transistor T1, a switching thin-film transistor T2, and a storage capacitor Cst.

The switching thin-film transistor T2 may be connected to a scan line SL and a data line DL and configured to transfer a data signal or a data voltage to the driving thin-film transistor T1 in response to a scan signal or a switching voltage input through the scan line SL. The data signal or data voltage may be input through the data line DL. The storage capacitor Cst may be connected between the switching thin-film transistor T2 and a driving voltage line PL and configured to store a voltage corresponding to a difference between a voltage transferred from the switching thin-film transistor T2 and a first power voltage ELVDD supplied through the driving voltage line PL.

The driving thin-film transistor T1 may be connected between the driving voltage line PL and the organic light-emitting diode OLED and configured to control a driving current flowing to the organic light-emitting diode OLED from the driving voltage line PL according to the voltage stored in the storage capacitor Cst. An opposite electrode (e.g. a cathode) of the organic light-emitting diode OLED may receive a second power voltage ELVSS. The organic light-emitting diode OLED may emit light having a preset brightness in accordance with the driving current.

Though the case where the pixel circuit PC includes two thin-film transistors and one storage capacitor is described, the embodiment is not limited thereto. As an example, the pixel circuit PC may include three or more thin-film transistors and/or two or more storage capacitors. In an embodiment, the pixel circuit PC may include seven thin-film transistors and one storage capacitor. The number of thin-film transistors and the number of storage capacitors may be variously changed depending on the design of the pixel circuit PC. Hereinafter, for convenience of description, the case where the pixel circuit PC includes two thin-film transistors and one storage capacitor is described.

Figure 4:
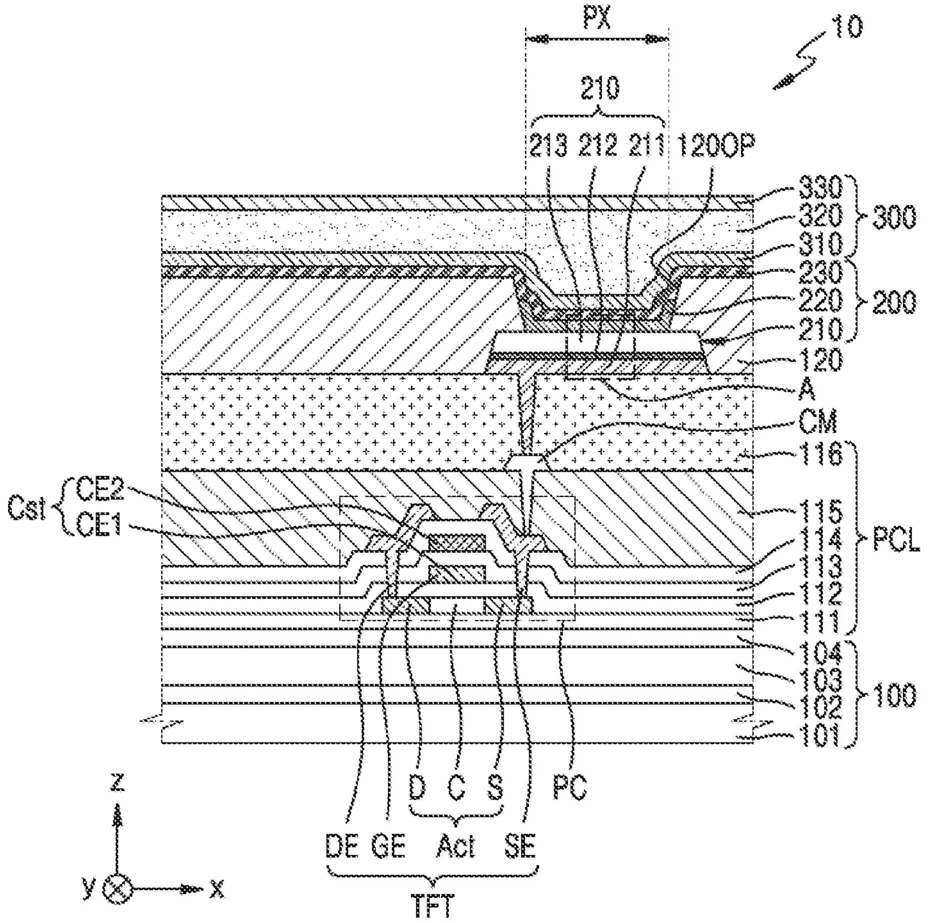
FIG. 4 is a cross-sectional view of a portion of a display panel of a display apparatus according to an embodiment.

FIG. 4 is a cross-sectional view of a portion of the display panel 10 of the display apparatus 1 according to an embodiment.

Referring to FIG. 4, the display panel 10 of the display apparatus 1 (see FIG. 2) may include a substrate 100, a pixel circuit layer PCL, a pixel-defining layer 120, a light-emitting element 200, and a thin-film encapsulation layer 300.

The substrate 100 may have a multi-layered structure including a base layer and an inorganic layer, the base layer including a polymer resin. As an example, the substrate 100 may include a base layer and a barrier layer, the base layer including a polymer resin, and the barrier layer being an inorganic insulating layer. As an example, the substrate 100 may include a first layer 101, a second layer 102, a third layer 103, and a fourth layer 104 that are sequentially stacked. The first layer 101 and the third layer 103 may include polyimide (PI), polyethersulfone (PES), polyarylate, polyetherimide (PEI), polyethylene naphthalate (PEN), polyethylene terephthalate (PET), polyphenylene sulfide (PPS), polycarbonate (PC), cellulose tri acetate (TAC), and/or cellulose acetate propionate (CAP). The second layer 102 and the fourth layer 104 may include an inorganic insulating material such as silicon oxide, silicon oxynitride, and silicon nitride. The substrate 100 may be flexible.

The pixel circuit layer PCL may be arranged on the substrate 100. The pixel circuit layer PCL may include the pixel circuit PC including a thin-film transistor TFT and a storage capacitor Cst. In addition, the pixel circuit layer PCL may include a buffer layer 111, a first gate insulating layer 112, a first interlayer insulating layer 113, a second interlayer insulating layer 114, a first planarization insulating layer 115, and a second planarization insulating layer 116 arranged under and/or over elements of the pixel circuit PC.

The buffer layer 111 may reduce or block the penetration of foreign substance, moisture, or external air from below the substrate 100 and provide a flat surface on the substrate 100. The buffer layer 111 may include an inorganic insulating material such as silicon oxide, silicon oxynitride, and silicon nitride and have a single-layered structure or a multi-layered structure including the above materials.

A thin-film transistor TFT disposed on the buffer layer 111 may include a semiconductor layer Act. The semiconductor layer Act may include polycrystalline silicon. Alternatively, the semiconductor layer Act may include amorphous silicon, an oxide semiconductor, or an organic semiconductor. The semiconductor layer Act may include a channel region C, a drain region D, and a source region S. The drain region D and the source region S may be disposed on two opposite sides of the channel region C. A gate electrode GE may overlap the channel region C.

The gate electrode GE may include a low-resistance metal material. The gate electrode GE may include a conductive material including molybdenum (Mo), aluminum (Al), copper (Cu), and titanium (Ti) and have a single-layered structure or a multi-layered structure including the above materials.

The first gate insulating layer 112 disposed between the semiconductor layer Act and the gate electrode GE may include an inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

The first interlayer insulating layer 113 may cover the gate electrode GE. Similar to the first gate insulating layer 112, the first interlayer insulating layer 113 may include an inorganic insulating material including silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$).

An upper electrode CE2 of the storage capacitor Cst may be arranged on the first interlayer insulating layer 113. The upper electrode CE2 may overlap the gate electrode GE disposed therebelow. In this case, the gate electrode GE and the upper electrode CE2 overlapping each other with the first interlayer insulating layer 113 disposed therebetween may constitute the storage capacitor Cst. That is, the gate electrode GE may serve as a lower electrode CE1 of the storage capacitor Cst.

As described above, the storage capacitor Cst may overlap the thin-film transistor TFT. In an embodiment, the storage capacitor Cst may not overlap the thin-film transistor TFT.

The upper electrode CE2 may include aluminum (Al), platinum (Pt), palladium (Pd), silver (Ag), magnesium (Mg), gold (Au), nickel (Ni), neodymium (Nd), iridium (Jr), chrome (Cr), calcium (Ca), molybdenum (Mo), titanium (Ti), tungsten (W), and/or copper (Cu) and include a single layer or a multi-layer including the above materials.

The second interlayer insulating layer 114 may cover the upper electrode CE2. The second interlayer insulating layer 114 may include silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), or zinc oxide ($ZnO_2$) The second interlayer insulating layer 114 may include a single layer or a multi-layer including the above inorganic insulating materials.

The drain electrode DE and the source electrode SE may be arranged on the second interlayer insulating layer 114. The drain electrode DE and the source electrode SE may be respectively connected to the drain region D and the source region S through contact holes formed in the insulating layers therebelow. The drain electrode DE and the source electrode SE may include a material having excellent conductivity. The drain electrode DE and the source electrode SE may include a conductive material including molybdenum (Mo), aluminum (Al), copper (Cu), and titanium (Ti) and have a single-layered structure or a multi-layered structure including the above materials. As an example, the drain electrode DE and the source electrode SE may have a multi-layered structure of Ti/Al/Ti.

The first planarization insulating layer 115 may cover the drain electrode DE and the source electrode SE. The first planarization insulating layer 115 may include an organic insulating material such as a general-purpose polymer including polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The second planarization insulating layer 116 may be arranged on the first planarization insulating layer 115. The second planarization insulating layer 116 may include the same material as that of the first planarization insulating layer 115 and include an organic insulating material such as a general-purpose polymer including polymethylmethacrylate (PMMA) or polystyrene (PS), polymer derivatives having a phenol-based group, an acryl-based polymer, an imide-based polymer, an aryl ether-based polymer, an amide-based polymer, a fluorine-based polymer, a p-xylene-based polymer, a vinyl alcohol-based polymer, and a blend thereof.

The light-emitting element 200 and the pixel-defining layer 120 may be arranged on the pixel circuit layer PCL. The light-emitting element 200 may be an organic light-emitting diode OLED. The organic light-emitting diode OLED may have a stack structure of a pixel electrode 210, an intermediate layer 220, and an opposite electrode 230. The organic light-emitting diode OLED may emit, for example, red, green, or blue light, or emit red, green, blue, or white light. The organic light-emitting diode OLED may emit light through an emission area.

The pixel electrode 210 may be arranged on the second planarization insulating layer 116. The pixel electrode 210 may be connected to a contact metal CM arranged on the first planarization insulating layer 115 through a contact hole formed in the second planarization insulating layer 116 and the first planarization insulating layer 115 and be electrically connected to the thin-film transistor TFT through the contact metal CM.

In an embodiment, the pixel electrode 210 may include a reflective layer 211, a barrier layer 212, and a transparent layer 213. The barrier layer 212 may be disposed on the reflective layer 211. The transparent layer 213 may be disposed on the barrier layer 212. The structure of the pixel electrode 210 is described below in detail with reference to FIGS. 5 and 6.

The pixel-defining layer 120 including an opening 120OP may be arranged on the pixel electrode 210. The opening 120OP may expose a central portion of the pixel electrode 210. The pixel-defining layer 120 may include an organic insulating material and/or an inorganic insulating material. The opening 120OP may define an emission area of light emitted from the light-emitting element 200. In an embodiment, the size/width of the opening 120OP may correspond to the size/width of the emission area. In this case, the size and/or the width of the pixel PX may depend on the size and/or the width of the opening 120OP of the pixel-defining layer 120 corresponding thereto.

The intermediate layer 220 may include an emission layer. The emission layer may emit light of a preset color. In an embodiment, the emission layer may include a polymer organic material or a low-molecular weight organic material. That is, the intermediate layer 220 may include an organic emission layer. In another embodiment, the emission layer may include an inorganic emission material or quantum dots.

A first functional layer (not shown) and a second functional layer (not shown) may be respectively arranged under and over the emission layer. The first functional layer may include, for example, a hole transport layer (HTL) and/or a hole injection layer (HIL). The second functional layer is an element arranged on the emission layer and may include an electron transport layer (ETL) and/or an electron injection layer (EIL). Like the opposite electrode 230 described below, the first functional layer and/or the second functional layer may be common layers covering the substrate 100 entirely.

The opposite electrode 230 may be arranged on the pixel electrode 210 to overlap the pixel electrode 210. The opposite electrode 230 may include a conductive material having a small work function. As an example, the opposite electrode 230 may include a (semi) transparent layer including silver (Ag), magnesium (Mg), aluminum (Al), platinum (Pt), palladium (Pd), gold (Au), nickel (Ni), neodymium (Nd), iridium (Jr), chrome (Cr), lithium (Li), calcium (Ca), or an alloy thereof. Alternatively, the opposite electrode 230 may further include a transparent conductive layer which includes ITO, IZO, ZnO, or $In_2O_3$ and is disposed on the (semi) transparent layer. The opposite electrode 230 may be formed as one body to cover the substrate 100 entirely.

The display panel 10 may include a plurality of light-emitting elements 200. The plurality of light-emitting elements 200 may display images by emitting light from the pixels PX. That is, the display area DA (see FIG. 2) may include the plurality of light-emitting elements 200.

The thin-film encapsulation layer 300 may be arranged on the opposite electrode 230 of the light-emitting element 200 and may cover the light-emitting elements 200. The thin-film encapsulation layer 300 may include at least one inorganic encapsulation layer and at least one organic encapsulation layer. In an embodiment, it is shown in FIG. 4 that the thin-film encapsulation layer 300 includes a first inorganic encapsulation layer 310, an organic encapsulation layer 320, and a second inorganic encapsulation layer 330 that are sequentially stacked.

The first inorganic encapsulation layer 310 and the second inorganic encapsulation layer 330 may include at least one inorganic material from among aluminum oxide, titanium oxide, tantalum oxide, hafnium oxide, zinc oxide, silicon oxide, silicon nitride, and silicon oxynitride. The organic encapsulation layer 320 may include a polymer-based material. The polymer-based material may include an acryl-based resin, an epoxy-based resin, polyimide, and polyethylene. In an embodiment, the organic encapsulation layer 320 may include acrylate. The organic encapsulation layer 320 may be formed by hardening a monomer or coating a polymer. The organic encapsulation layer 320 may have transparency.

Figure 5:
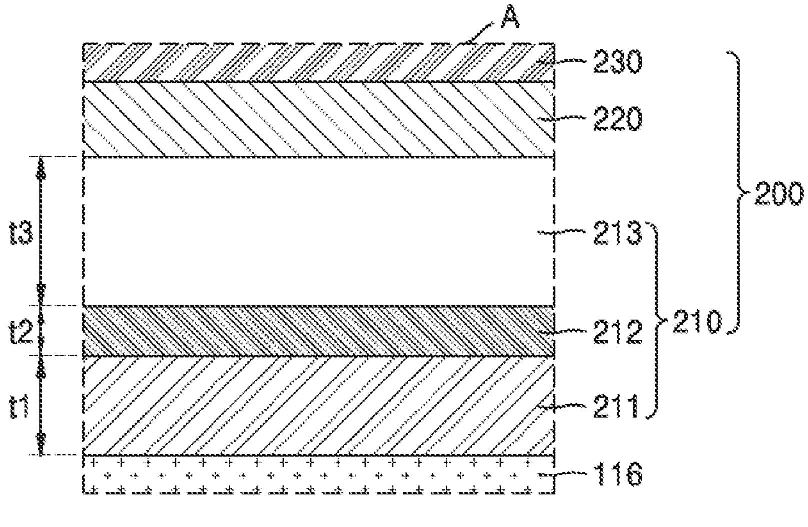
FIG. 5 is a cross-sectional view of a portion of a display panel of a display apparatus according to an embodiment.

FIG. 5 is a cross-sectional view of a portion of the display panel 10 of a display apparatus according to an embodiment and corresponds to a region A of the display panel 10 of FIG. 4.

Referring to FIG. 5, the display panel 10 (see FIGS. 2 and 4) of the display apparatus 1 (see FIG. 2) according to an embodiment may include the pixel electrode 210, the opposite electrode 230, and the intermediate layer 220 disposed between the pixel electrode 210 and the opposite electrode 230.

In an embodiment, the pixel electrode 210 may include the reflective layer 211, the transparent layer 213, and the barrier layer 212. The reflective layer 211 may include a first metal, the transparent layer 213 may be disposed on the reflective layer 211, and the barrier layer 212 may be disposed between the reflective layer 211 and the transparent layer 213.

In an embodiment, the reflective layer 211 of the pixel electrode 210 may include a low-resistance material and have a high reflectivity. As an example, the first metal of the reflective layer 211 may include aluminum (Al) or an aluminum alloy. Though the aluminum alloy may include, for example, metal such as nickel (Ni), lanthanum (La), titanium (Ti), molybdenum (Mo) and the like, the embodiment is not limited thereto.

In an embodiment, the transparent layer 213 may include a transparent conductive oxide. As an example, the transparent layer 213 may include a transparent conductive oxide such as indium tin oxide (ITO), indium zinc oxide (IZO), zinc oxide (ZnO), indium oxide ($In_2O_3$), indium gallium oxide (IGO), or aluminum zinc oxide (AZO). The transparent layer 213 has a high work function and thus may improve a light-emission efficiency.

In an embodiment, the barrier layer 212 may include an oxide of a second metal different from the first metal which constitutes the reflective layer 211. Here, the second metal may be titanium (Ti). That is, the barrier layer 212 may include titanium oxide ($TiO_x$). The barrier layer 212 may have a relatively high light transmittance. Because the barrier layer 212 is arranged between the reflective layer 211 and the transparent layer 213, material may be prevented from diffusing between the reflective layer 211 and the transparent layer 213.

Furthermore, because the barrier layer 212 arranged between the reflective layer 211 and the transparent layer 213 includes a titanium oxide, a contact resistance between the reflective layer 211 and the transparent layer 213 may be reduced. As a comparative example, in the case where the barrier layer 212 is not provided, the sheet resistance is about $10^{-2}$ Ω/cm$^2$ to $10^{-1}$ Ω/cm$^2$. In contrast, according to an embodiment, in the case where the barrier layer 212 including a titanium oxide is arranged between the reflective layer 211 and the transparent layer 213, the sheet resistance may be $10^{-4}$ Ω/cm$^2$ or less.

The pixel-defining layer 120 (see FIG. 4) arranged on the pixel electrode 210 may be formed by a photolithography process and a descum process. Specifically, a preliminary pixel-defining layer is formed on the pixel electrode 210, and then the preliminary pixel-defining layer may be patterned through an exposure process and a developing process. In this case, the pixel-defining layer 120 may be formed by patterning the preliminary pixel-defining layer such that the preliminary pixel-defining layer exposes the central portion of the pixel electrode 210. After the patterning, the pixel-defining layer 120 may not be completely removed from a region corresponding to the opening 120OP of the pixel-defining layer 120 and a portion of the pixel-defining layer 120 may remain as a residual layer on the upper surface of the pixel electrode 210. To remove the residual layer on the pixel electrode 210, a descum process that uses dry etching may be performed.

As a comparative example, in the case where the pixel electrode 210 includes a stack structure of an ITO layer/a silver (Ag) layer/an ITO layer, an etching gas used in the descum process may penetrate into the silver (Ag) layer through fine pin holes inside the ITO layer, and as a result, the silver (Ag) layer may be damaged and silver (Ag) may be eluted to the surface of the pixel electrode 210. This may cause defects of the light-emitting element 200.

In contrast, according to an embodiment, because the reflective layer 211 of the pixel electrode 210 includes aluminum (Al) and/or an aluminum alloy instead of silver (Ag), the elution of the silver (Ag) may be prevented. In addition, because the barrier layer 212 is arranged between the reflective layer 211 and the transparent layer 213, an etching gas may be prevented from penetrating to the reflective layer 211 through the transparent layer 213 during the descum process. Accordingly, a damage to the reflective layer 211 may be reduced and a defect rate of the light-emitting element 200 may be reduced.

In an embodiment, the reflective layer 211 of the pixel electrode 210 may have a thickness t1 in a range of about 500 Å to about 5000 Å. When the thickness t1 of the reflective layer 211 is less than 500 Å, the reflectivity of the reflective layer 211 may be reduced and the surface resistance of the pixel electrode 210 may increase. When the thickness t1 of the reflective layer 211 is greater than 5000 Å, a process efficiency may be deteriorated.

The barrier layer 212 may have a sufficiently thin thickness t2 to reduce a reflectivity loss of the barrier layer 212. As an example, the barrier layer 212 may have the thickness t2 in a range of about 5 Å to about 100 Å. When the thickness t2 of the barrier layer 212 is less than 5 Å, the thickness uniformity of the barrier layer 212 may not be secured. When the thickness t2 of the barrier layer 212 is greater than 100 Å, a reflectivity loss of the pixel electrode 210 may increase and a light efficiency may be deteriorated.

In an embodiment, though the transparent layer 213 may have a thickness in a range of about 5 Å to about 1000 Å or about 5 Å to about 200 Å, the embodiment is not limited thereto.

Figure 6:
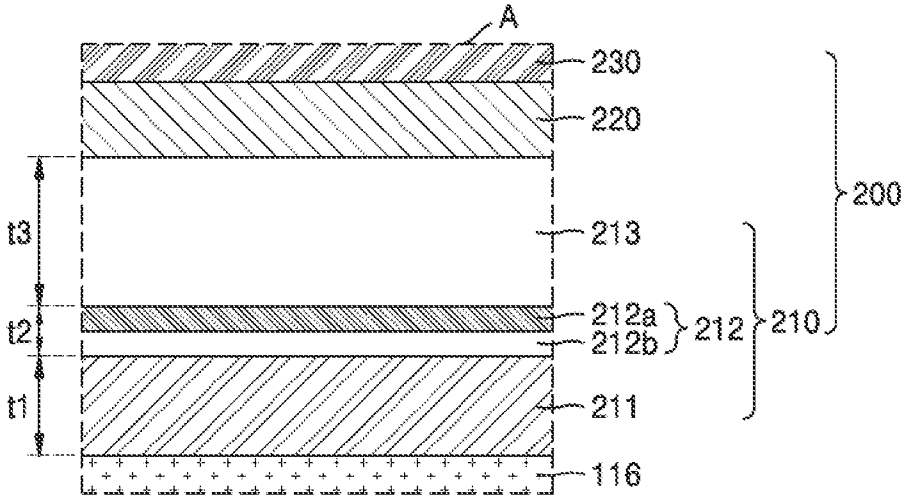
FIG. 6 is a cross-sectional view of a portion of a display panel of a display apparatus according to another embodiment.

FIG. 6 is a cross-sectional view of a portion of the display panel 10 of the display apparatus 1 according to another embodiment. Descriptions of the same elements as those described with reference to FIG. 5 are omitted and differences are mainly described below.

Referring to FIG. 6, the barrier layer 212 of the pixel electrode 210 may include a first barrier layer 212*a* and a second barrier layer 212*b*. The first barrier layer 212*a* may include an oxide of the second metal different from the first metal of the reflective layer 211. Here, the second metal may be titanium (Ti). That is, the first barrier layer 212*a* may include a titanium oxide ($TiO_x$). The second barrier layer 212*b* may be arranged between the reflective layer 211 and the first barrier layer 212*a* and may include the second metal. That is, the second barrier layer 212*b* may include titanium (Ti) and may not include a titanium oxide (TiOx).

In an embodiment, a sum of the thickness of the first barrier layer 212*a* and the thickness of the second barrier layer 212*b* may be in a range of about 5 Å to about 100 Å. That is, the entire thickness t2 of the barrier layer 212 may be in a range of about 5 Å to about 100 Å. Because the entire thickness t2 of the barrier layer 212 is provided sufficiently thin, a reflectivity loss may be reduced.

Figure 7A:
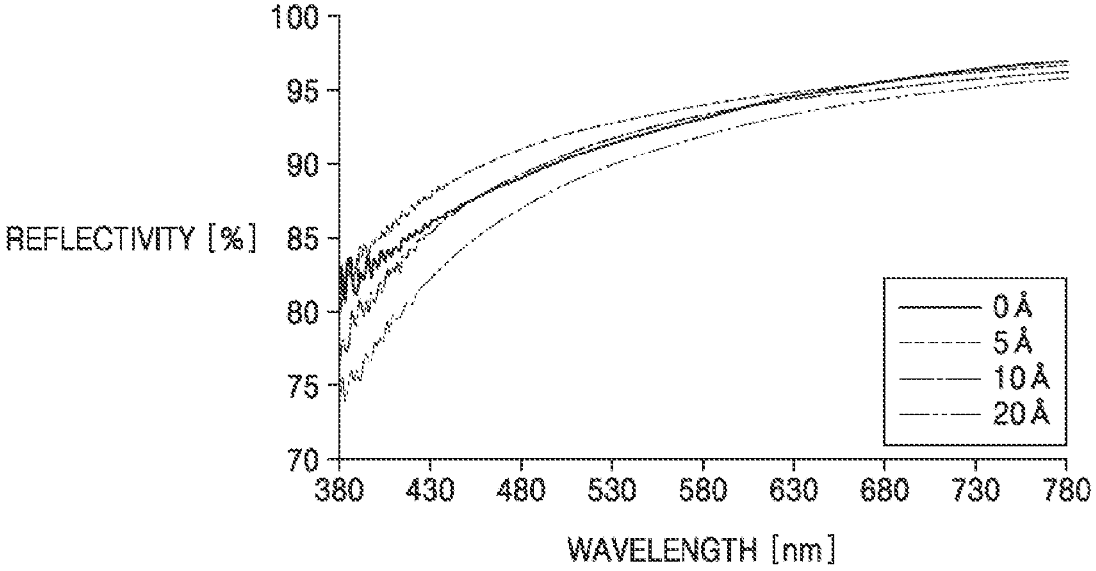
FIGS. 7A and 7B are graphs showing reflectivity of a pixel electrode according to wavelength.
Figure 7B:
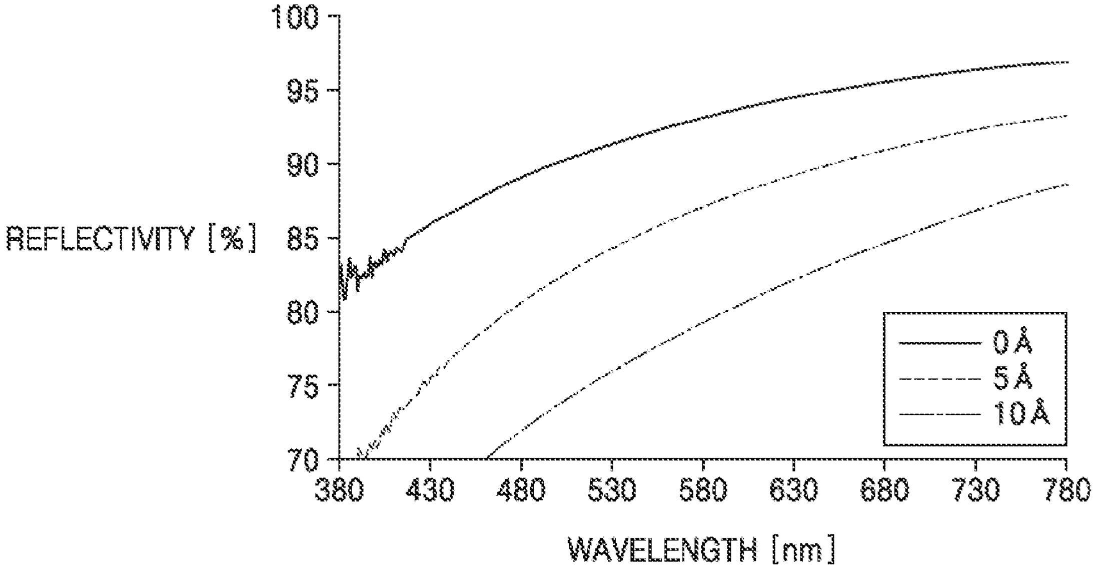

FIGS. 7A and 7B are graphs showing reflectivity of a pixel electrode according to wavelengths. FIG. 7A shows a reflectivity of the barrier layer 212 that includes a titanium oxide according to wavelengths, and FIG. 7B shows a reflectivity of the barrier layer 212 that includes molybdenum according to wavelengths in a comparative example.

Referring to FIG. 7A, a horizontal axis of the graph denotes a wavelength of light and a vertical axis denotes the reflectivity of the pixel electrode 210 (see FIG. 5). A solid line is a reference comparative example and denotes reflectivity according to wavelengths when no barrier layer is exist between the reflective layer and the transparent layer and includes only the reflective layer and the transparent layer.

A dotted line, an alternated long and short dash line, and an alternate long and two short dashes line denote reflectivity according to wavelengths in the case where the pixel electrode 210 includes the barrier layer 212 including a titanium oxide and the thicknesses t2 (see FIG. 5) of the barrier layer 212 are 5 Å, 10 Å, and 20 Å.

Referring to FIG. 7B, a solid line is a reference comparative example and denotes reflectivity according to wavelengths in the case where the pixel electrode 210 does not include the barrier layer 212 as described above. A dotted line and an alternated long and short dash line are comparative examples and denotes reflectivity according to wavelengths in the case where the pixel electrode 210 includes the barrier layer 212 including a metal oxide, for example, a molybdenum oxide, other than a titanium oxide and the thicknesses t2 of the barrier layer 212 are 5 Å and 10 Å.

Referring to the graph of FIG. 7B, in the case where the barrier layer 212 includes a molybdenum oxide, it is revealed that the reflectivity of the pixel electrode 210 is deteriorated significantly compared to the reference comparative example. That is, a reflectivity loss is large.

In contrast, referring to the graph of FIG. 7A, in the case where the barrier layer 212 includes a titanium oxide according to an embodiment, it is revealed that the reflectivity of the pixel electrode 210 is similar to the reference comparative example. That is, a reflectivity loss may be reduced.

FIGS. 8A to 8K are cross-sectional views showing a method of manufacturing a display apparatus according to an embodiment. Specifically, FIGS. 8A to 8K shows manufacturing process of a display panel provided to a display apparatus. Same reference numerals are given to the same elements as those described with reference to FIG. 4, and thus, detailed descriptions thereof are omitted.

Figure 8A:
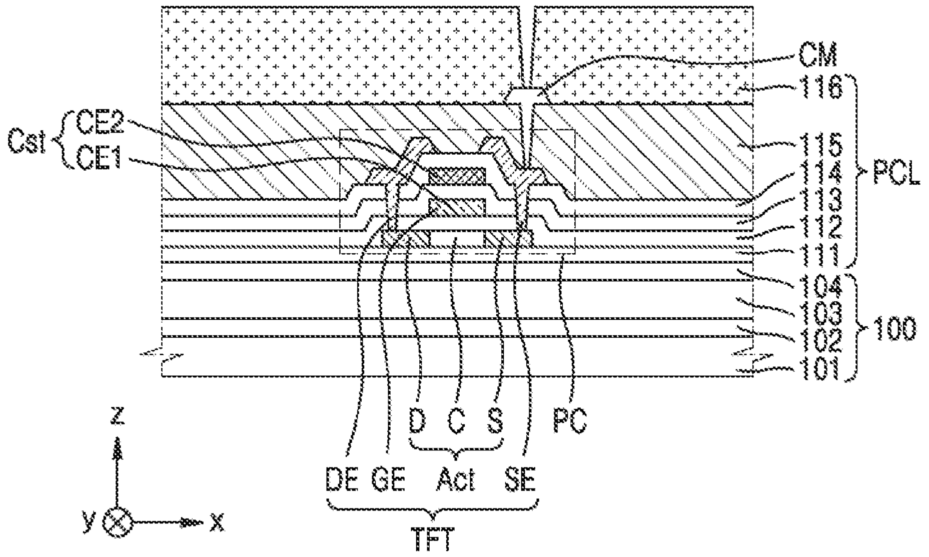
FIGS. 8A, 8B, 8C, 8D, 8E, 8F, 8G, 8H, 8I, 8J and 8K are cross-sectional views showing a method of manufacturing a display apparatus according to an embodiment.

Referring to FIG. 8A, the substrate 100 is prepared and then the pixel circuit layer PCL may be formed on the substrate 100. To form the pixel circuit PC, various insulating layers, a semiconductor layer, and an electrode layer may be formed on the substrate 100. As an example, various material layers are formed by a coating process or a deposition process, and then the various insulating layers, the semiconductor layer, and the electrode layer may be formed by patterning the various material layers through a photolithography process.

Here, for the coating process, spin coating and the like may be used for example. For a deposition process, chemical vapor deposition (CVD) such as thermochemical vapor deposition (TCVD), plasma enhanced chemical vapor deposition (PECVD), atmospheric pressure chemical vapor deposition (APCVD), and the like or physical vapor deposition (PVD) such as thermal evaporation, sputtering, e-beam evaporation and the like may be used.

After the pixel circuit layer PCL is formed, the pixel electrode 210 (see FIG. 4) may be formed. The pixel electrode 210 may be formed over the substrate 100, for example, on the second planarization insulating layer 116. A process of forming the pixel electrode 210 is described below in detail with reference to FIGS. 8B to 8H.

Figure 8B:
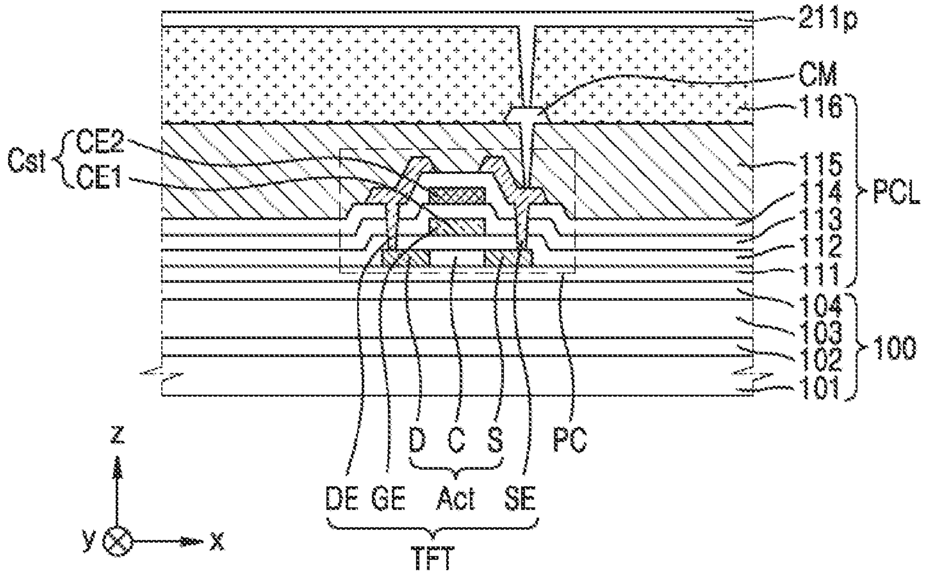

Referring to FIG. 8B, a preliminary reflective layer 211*p* including the first metal may be formed on the second planarization insulating layer 116. In an embodiment, a coating process or a deposition process may be used for forming the preliminary reflective layer 211*p*. For example, the preliminary reflective layer 211*p* may be formed by spin coating.

The first metal of the preliminary reflective layer 211*p* may include a low-resistance material and have a high reflectivity. In an embodiment, the first metal of the preliminary reflective layer 211*p* may be aluminum or an aluminum alloy. Though the aluminum alloy may include metal, for example, nickel (Ni), lanthanum (La), titanium (Ti), molybdenum (Mo) and the like, the embodiment is not limited thereto.

Figure 8C:
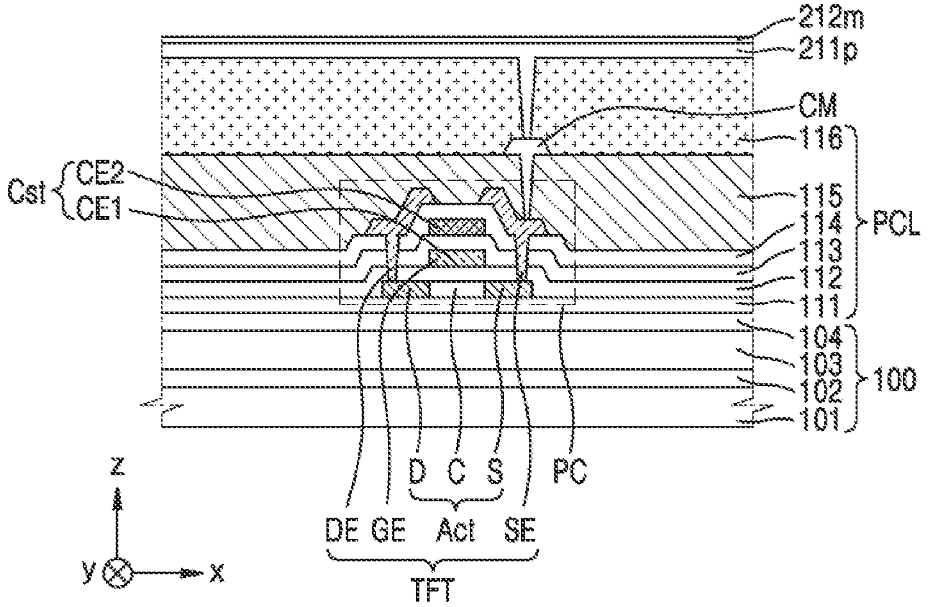

Referring to FIG. 8C, a metal thin film 212*m* may be formed on the preliminary reflective layer 211*p*, the metal thin film 212*m* including the second metal different from the first metal. In an embodiment, a coating process or a deposition process may be used for forming the metal thin film 212*m*. For example, the metal thin film 212*m* may be formed by spin coating. In an embodiment, the second metal of the metal thin film 212*m* may be titanium (Ti).

Figure 8D:
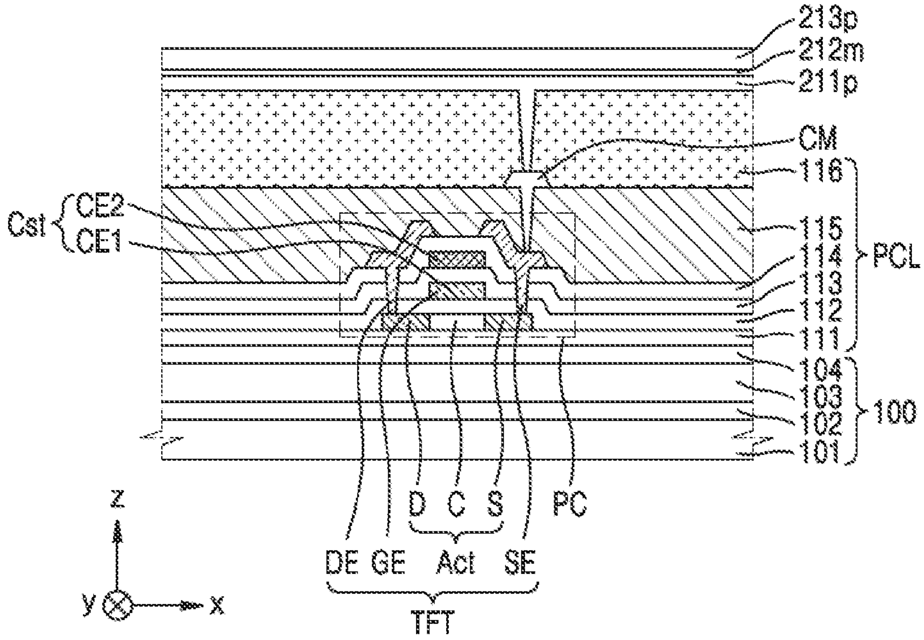

Referring to FIG. 8D, a preliminary transparent layer 213*p* may be formed on the metal thin film 212*m*. In an embodiment, a coating process or a deposition process may be used in forming the preliminary transparent layer 213*p*. In an embodiment, the preliminary transparent layer 213*p* may include a transparent conductive oxide such as indium tin oxide (ITO), indium zinc oxide (IZO), zinc oxide (ZnO), indium oxide ($In_2O_3$), indium gallium oxide (IGO), or aluminum zinc oxide (AZO).

Figure 8E:
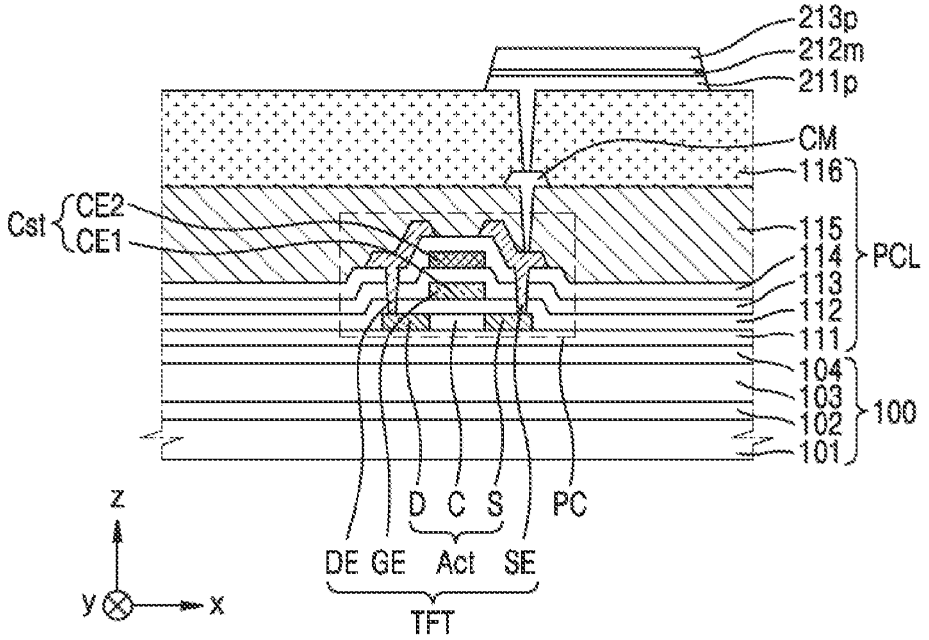

Referring to FIG. 8E, the preliminary reflective layer 211*p*, the metal thin film 212*m*, and the preliminary transparent layer 213*p* may be patterned. Photolithography including coating, exposure, developing, and an etching process may be used for the patterning. Specifically, a photoresist pattern layer may be formed by coating a photoresist on the preliminary transparent layer 213*p*, exposing the photoresist through a first mask including a pattern corresponding to the pixel electrode 210, and then developing the photoresist. Here, the photoresist may be a positive type photoresist or a negative type photoresist. Then, the patterning may be performed by etching the preliminary reflective layer 211*p*, the metal thin film 212*m*, and the preliminary transparent layer 213*p* using the photoresist pattern layer as an etch mask. Then, the photoresist pattern layer may be removed.

Figure 8F:
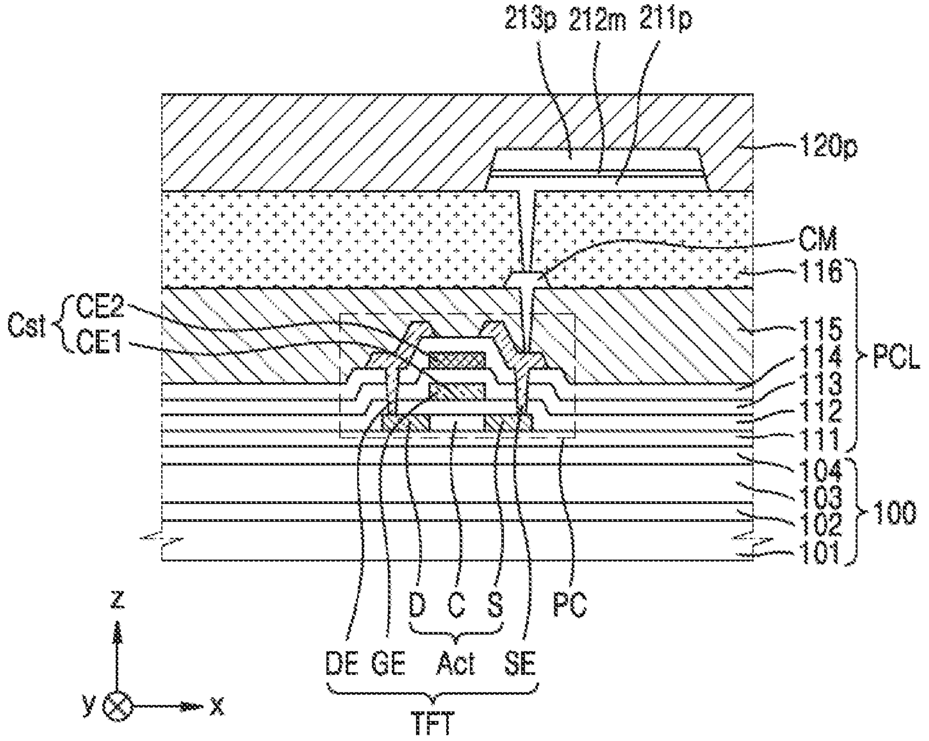

Referring to FIG. 8F, a preliminary pixel-defining layer 120*p* may be formed on the preliminary transparent layer 213*p* that is patterned. The preliminary pixel-defining layer 120*p* may cover the preliminary reflective layer 211*p*, the metal thin film 212*m*, and the preliminary transparent layer 213*p* entirely. In an embodiment, the preliminary pixel-defining layer 120*p* may include a photoresist.

Figure 8G:
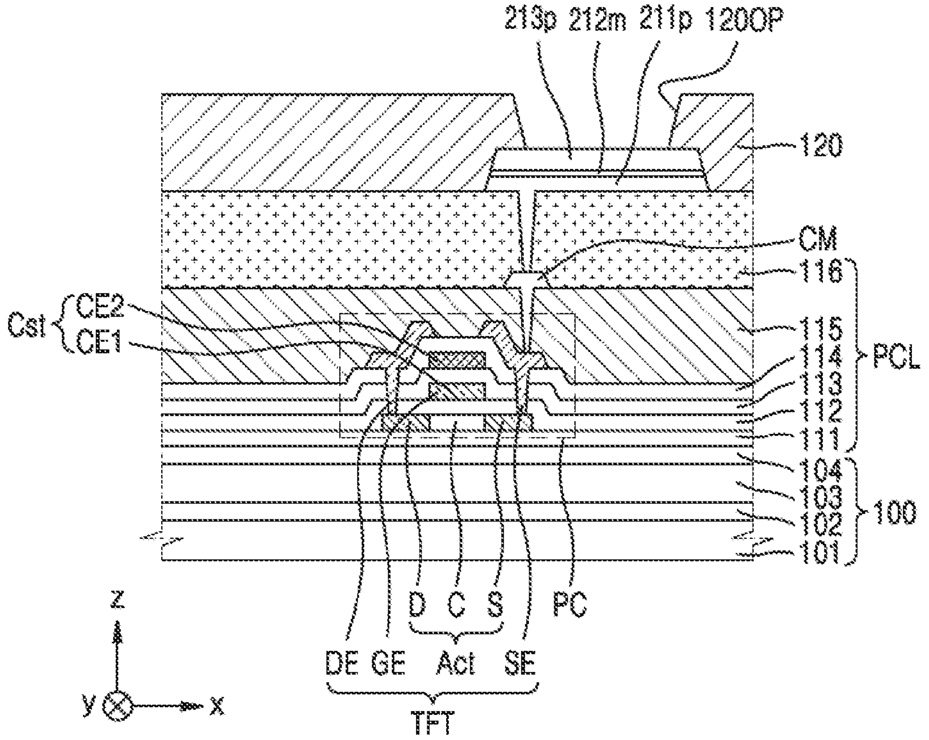

Referring to FIG. 8G, the pixel-defining layer 120 may be formed by patterning the preliminary pixel-defining layer 120*p* (see FIG. 8F). Because the preliminary pixel-defining layer 120*p* includes a photoresist, the preliminary pixel-defining layer 120*p* may be patterned by exposing the preliminary pixel-defining layer 120*p* through a second mask having a preset pattern and then developing the same. The second mask may have a pattern corresponding to the opening 120OP of the pixel-defining layer 120. That is, the pixel-defining layer 120 that is patterned may define the opening 120OP that exposes at least a portion of the preliminary transparent layer 213*p*.

Even after the pixel-defining layer 120 is patterned, the pixel-defining layer 120 is not completely removed and a portion thereof may remain as a residual layer on the upper surface of the central portion of the preliminary transparent layer 213*p*. To remove this residual layer, a descum process may be performed by using an etch gas.

Figure 8H:
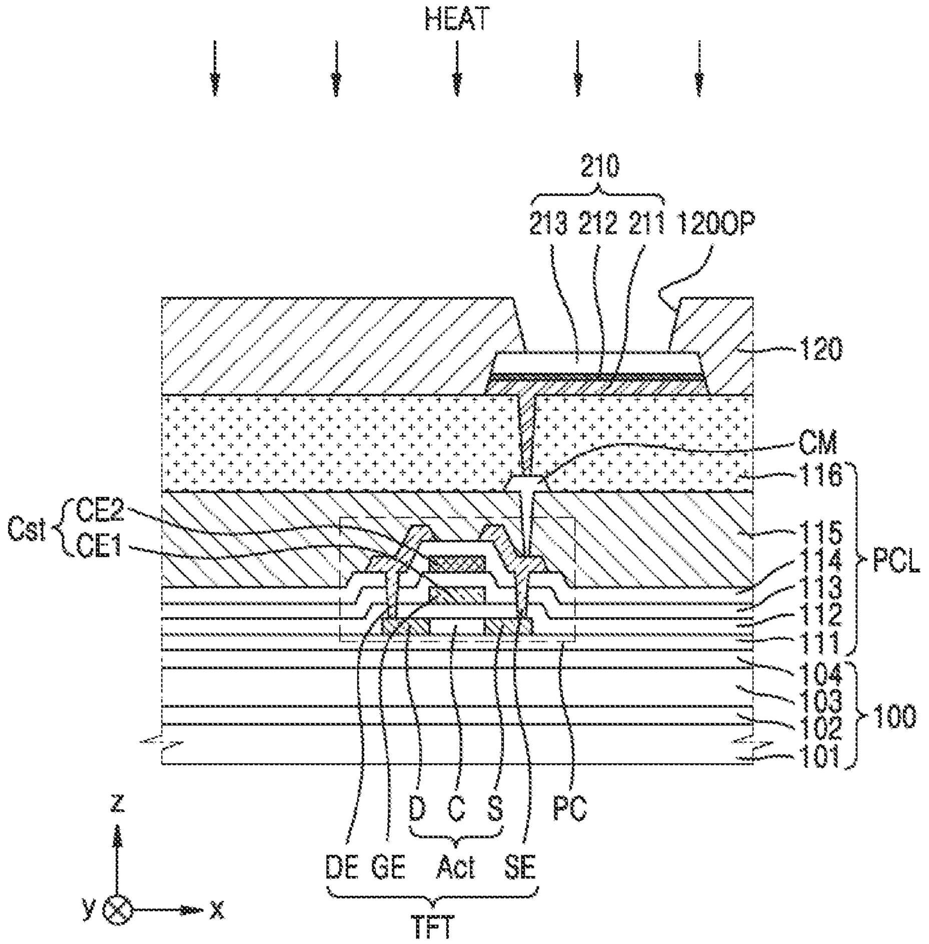

Referring to FIG. 8H, the pixel-defining layer 120 may be heat-treated. A high-temperature heat treatment may be performed for a preset time to harden an organic material included in the pixel-defining layer 120. Through this, the pattern of the pixel-defining layer 120 may not collapse and may be maintained.

According to an embodiment, the barrier layer 212 may be formed by oxidizing at least a portion of the metal thin film 212*m* (see FIG. 8G) that is patterned. As an example, the barrier layer 212 may be formed by oxidizing at least a portion of the metal thin film 212*m* during a heat treatment process of the pixel-defining layer 120. Because the upper surface of the metal thin film 212*m* contacts the preliminary transparent layer 213*p* (see FIG. 8G) including oxygen, it may be oxidized from the upper surface of the metal thin film 212*m* that is patterned during the heat treatment process. As a result, because at least a portion of the metal thin film 212*m* that is patterned is oxidized, the barrier layer 212 is formed, and as described above, because the metal thin film 212*m* that is patterned includes titanium as an example, the barrier layer 212 includes a titanium oxide. The barrier layer 212 may constitute the pixel electrode 210 with the reflective layer 211 and the transparent layer 213 respectively arranged under and on the barrier layer 212.

In an embodiment, the barrier layer 212 may include a first barrier layer 212*a* and a second barrier layer 212*b* depending on the thickness of the metal thin film 212*m*, the first barrier layer 212*a* including titanium oxide, and the second barrier layer 212*b* including titanium. As an example, when the thickness of the metal thin film 212*m* is greater than a preset thickness, only the upper portion of the metal thin film 212*m* is oxidized and the lower portion thereof remains as it is. Here, the first barrier layer 212*a* may be arranged on the second barrier layer 212*b*. This embodiment may be the embodiment described above with reference to FIG. 6.

The reflective layer of the pixel electrode 210 may have a thickness in a range of about 500 Å to 5000 Å, and the barrier layer 212 may have a thickness in a range of about 5 Å to about 100 Å. With regard to this, because description has been made above in detail with reference to FIG. 5, repeated description is omitted.

Figure 8I:
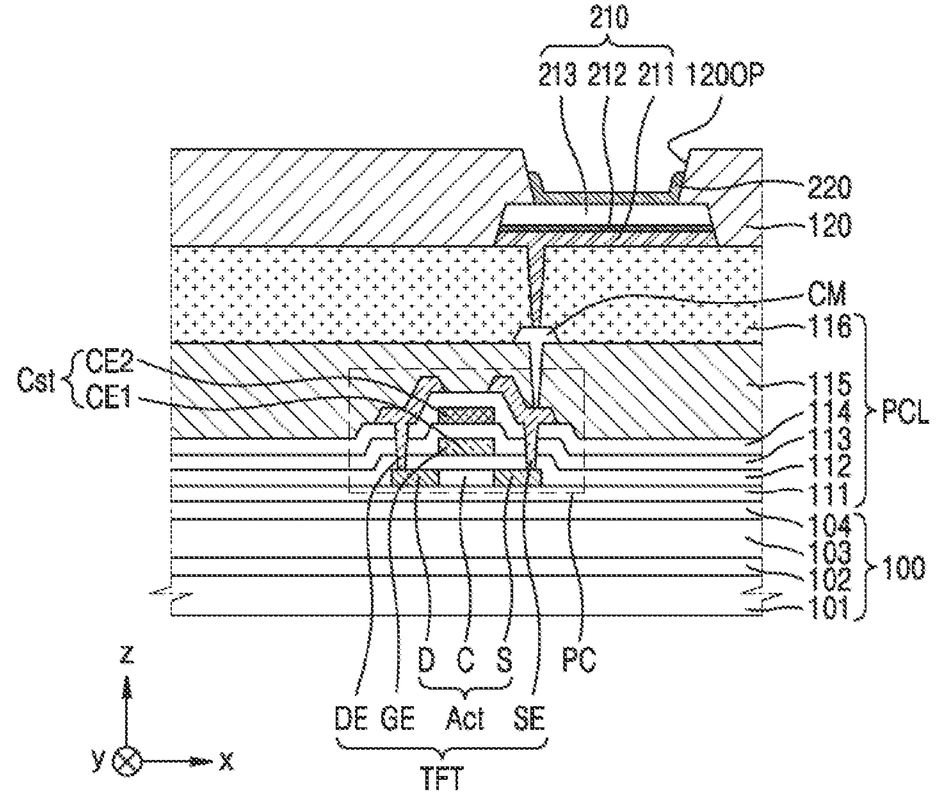

Referring to FIG. 8I, the intermediate layer 220 may be formed on the pixel electrode 210. In an embodiment, the intermediate layer 220 may be formed in the opening 120OP of the pixel-defining layer 120. In another embodiment, though not shown, the intermediate layer 220 may be formed as one body to cover the upper surface of the pixel-defining layer 120 and cover the plurality of pixel electrodes 210. In an embodiment, the intermediate layer 220 may be formed by an inkjet printing process.

Figure 8J:
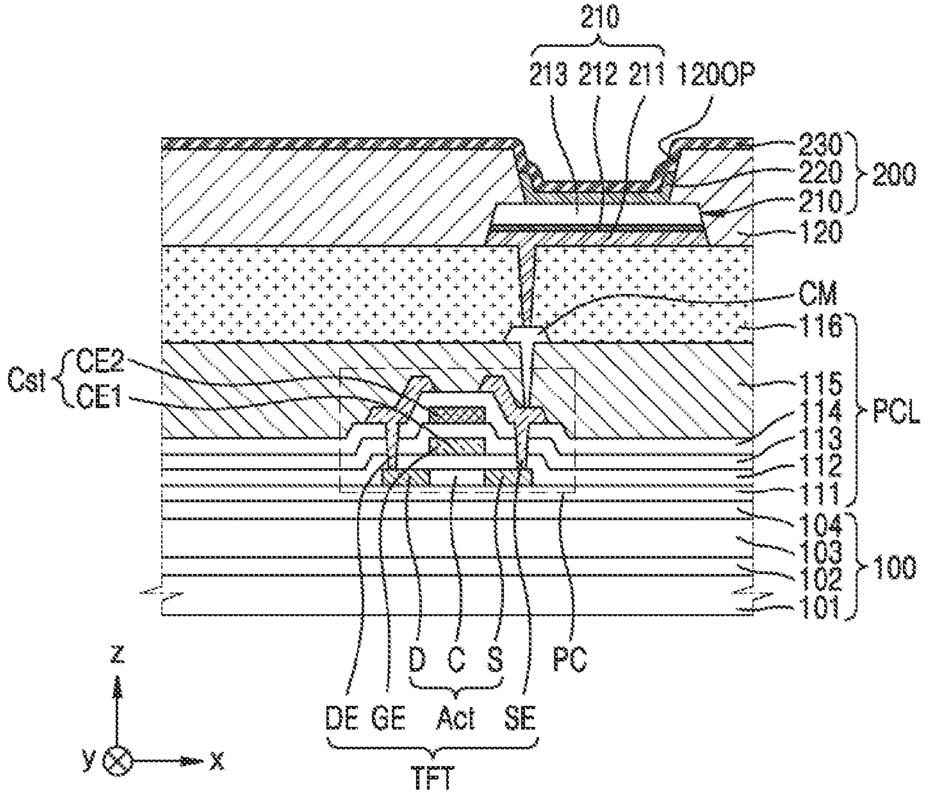

Referring to FIG. 8J, the opposite electrode 230 may be formed to cover the intermediate layer 220. In an embodiment, the opposite electrode 230 may be formed by a coating process or a deposition process. The opposite electrode 230 may constitute the light-emitting element 200 with the pixel electrode 210 and the intermediate layer 220.

Figure 8K:
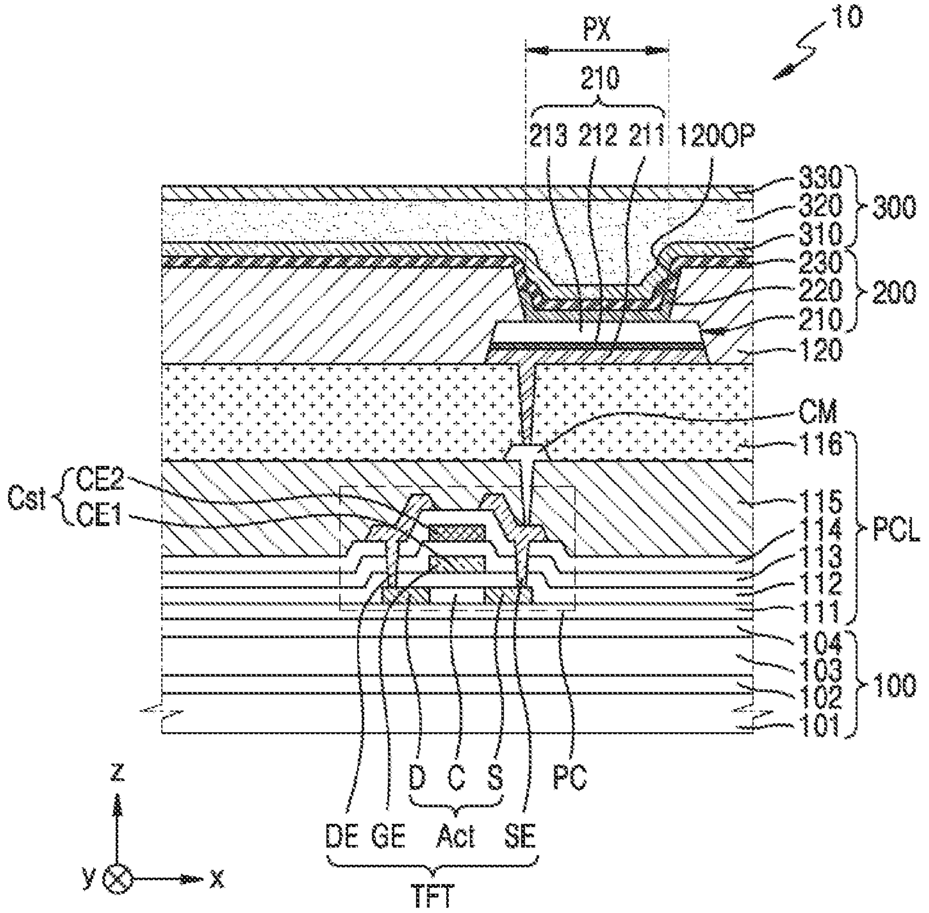

Referring to FIG. 8K, the thin-film encapsulation layer 300 may be formed on the light-emitting element 200 to cover the light-emitting element 200. Through this, the display panel 10 of the display apparatus 1 (see FIG. 2) may be manufactured. In an embodiment, the input sensing layer 40 (see FIG. 2) and the optical functional layer 60 (see FIG. 2) are formed on the display panel 10 and adhered to the cover window 80, and thus, the display apparatus 1 may be finally manufactured.

FIGS. 9A to 9E are cross-sectional views showing a method of manufacturing a display apparatus according to another embodiment. Specifically, FIGS. 9A to 9E show manufacturing process of the display panel provided to the display apparatus.

Figure 9A:
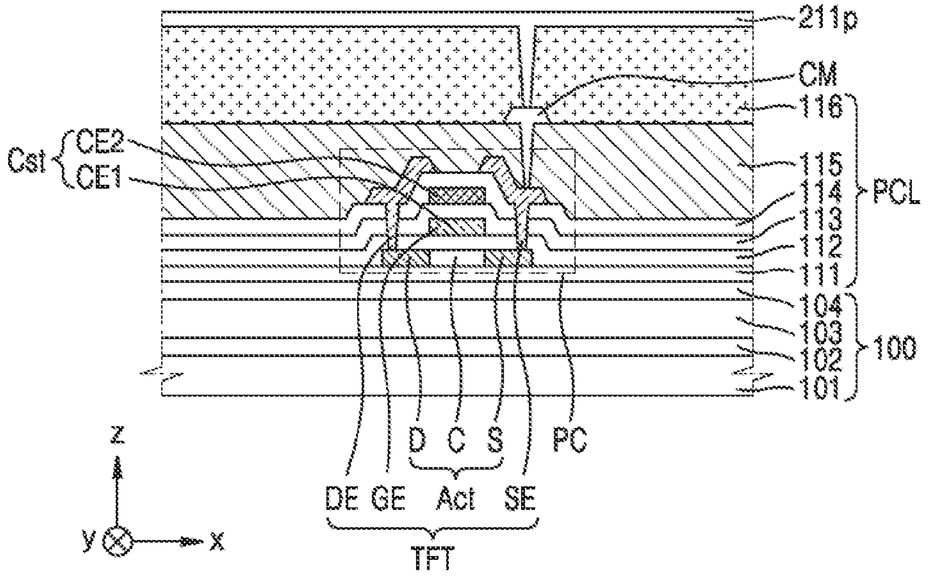
FIGS. 9A, 9B, 9C, 9D and 9E are cross-sectional views showing a method of manufacturing a display apparatus according to another embodiment.

Referring to FIG. 9A, the pixel circuit layer PCL may be formed over the substrate 100, and the preliminary reflective layer 211*p* may be formed on the second planarization insulating layer 116 of the pixel circuit layer PCL. The preliminary reflective layer 211*p* may include the first metal. As an example, the first metal of the preliminary reflective layer 211*p* may be aluminum or an aluminum alloy. Because the state shown in FIG. 9A is substantially the same as the state shown in FIG. 8B, repeated description is omitted.

Figure 9B:
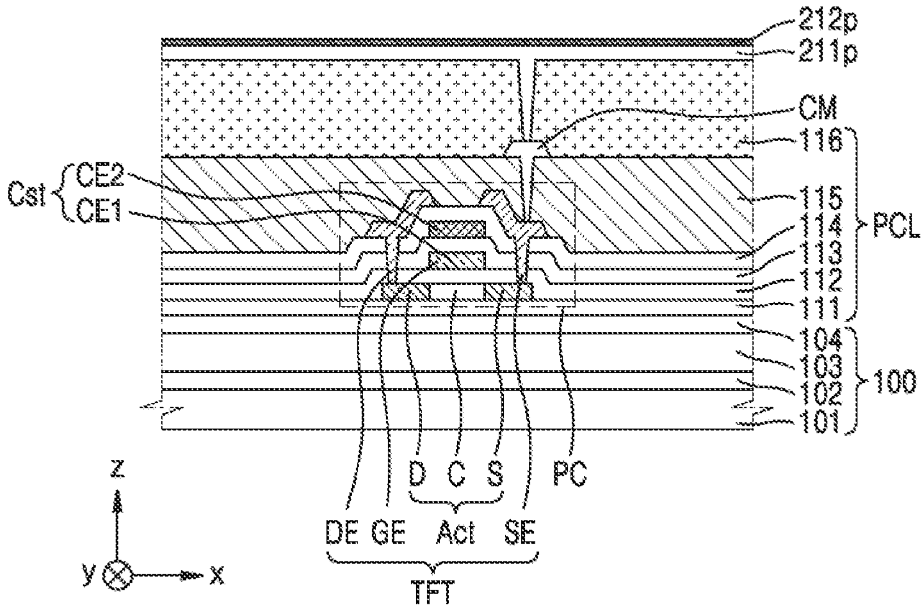

Referring to FIG. 9B, a preliminary barrier layer 212*p* may be formed on the preliminary reflective layer 211*p* by a reactive sputtering process. The preliminary barrier layer 212*p* may include an oxide of the second metal different from the first metal. Here, the second metal may be titanium (Ti), and thus, the preliminary barrier layer 212*p* may include titanium oxide ($TiO_x$). The reactive sputtering process may be performed by using an oxygen gas ($O_2$) as a reactive gas. That is, the preliminary barrier layer 212*p* may be directly formed on the preliminary reflective layer 211*p* by the reactive sputtering process, the preliminary barrier layer 212*p* including titanium oxide.

Figure 9C:
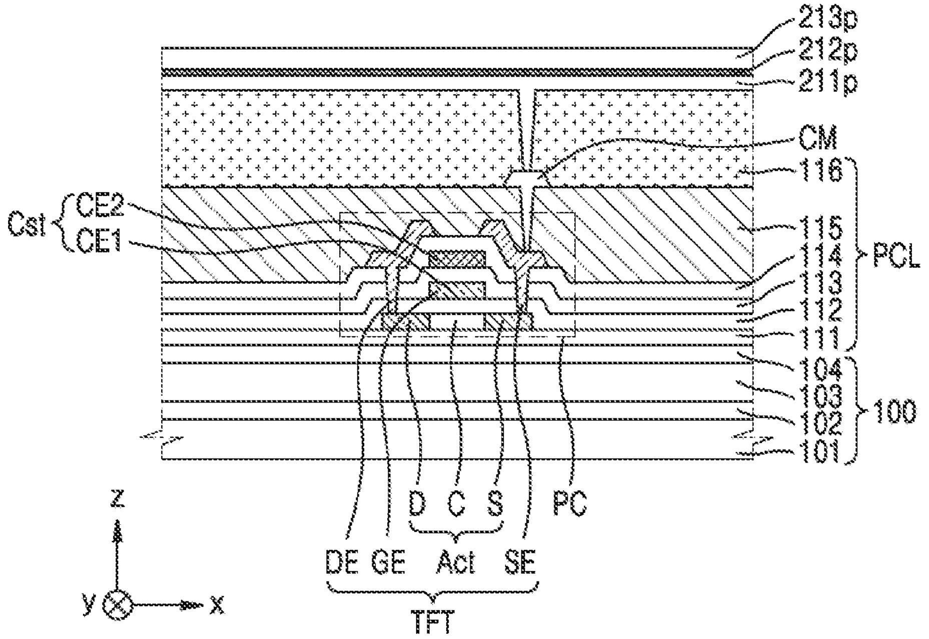

Referring to FIG. 9C, the preliminary transparent layer 213*p* may be formed on the preliminary barrier layer 212*p*. Description thereof is the same as the description made above with reference to FIG. 8D.

Figure 9D:
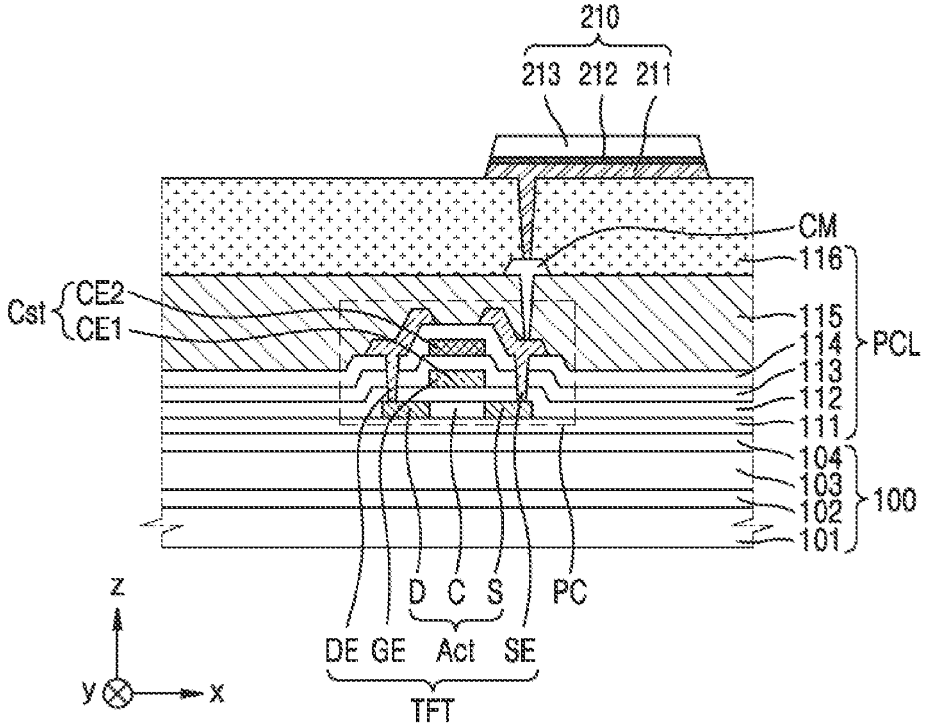

Referring to FIG. 9D, the preliminary reflective layer 211*p*, the preliminary barrier layer 212*p*, and the preliminary transparent layer 213*p* may be patterned. Through this, the pixel electrode 210 including the reflective layer 211, the barrier layer 212, and the transparent layer 213 may be formed over the substrate 100. For the patterning, a photolithography process may be used, and specific descriptions thereof are the same as those made above with reference to FIG. 8E.

The reflective layer of the pixel electrode 210 may have a thickness in a range of about 500 Å to about 5000 Å, and the barrier layer 212 may have a thickness in a range of about 5 Å to about 100 Å. With regard to this, description has been made above in detail with reference to FIG. 5, and thus, repeated description is omitted.

Figure 9E:
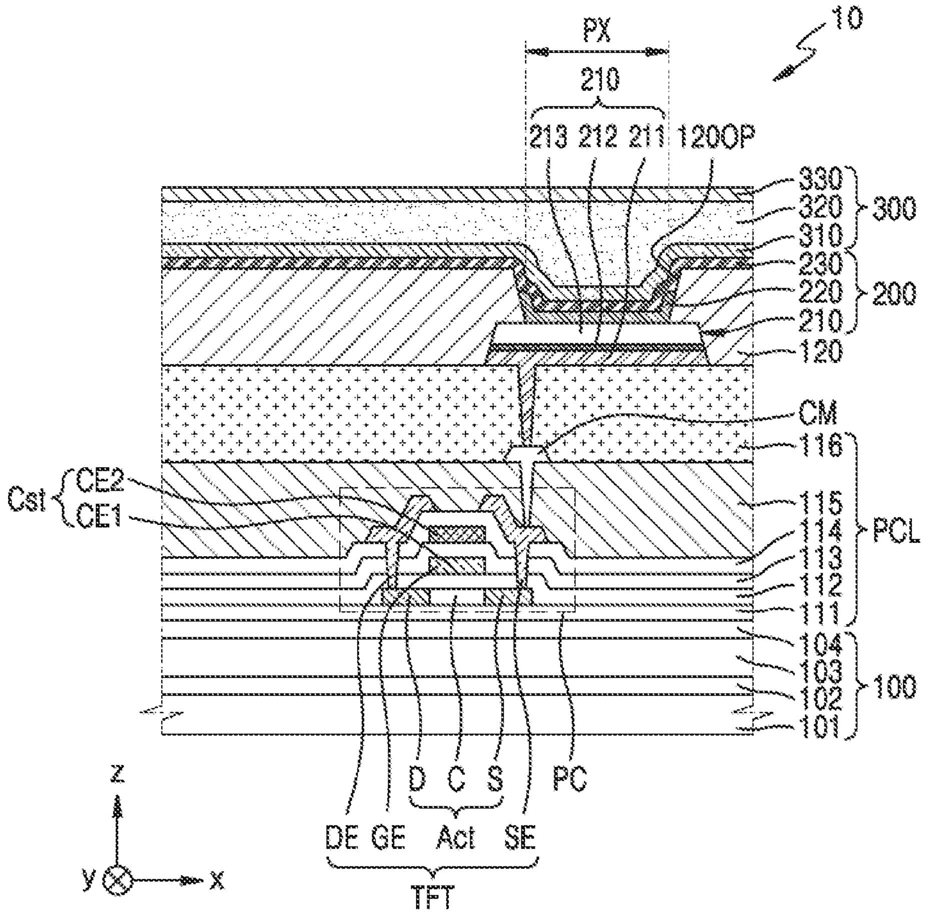

Referring to FIG. 9E, the pixel-defining layer 120 may be formed on the pixel electrode 210, then the intermediate layer 220 may be formed on the pixel electrode 210, and the opposite electrode 230 may be formed on the intermediate layer 220 to cover the intermediate layer 220. Through this, the light-emitting element 200 may be formed. Then, the display panel 10 of the display apparatus 1 (see FIG. 2) may be manufactured by forming the thin-film encapsulation layer 300 on the light-emitting element 200 to cover the light-emitting element 200. In an embodiment, the input sensing layer 40 (see FIG. 2) and the optical functional layer 60 (see FIG. 2) are formed on the display panel 10 and adhered to the cover window 80, and thus, the display apparatus 1 may be finally manufactured.

Figure 10:
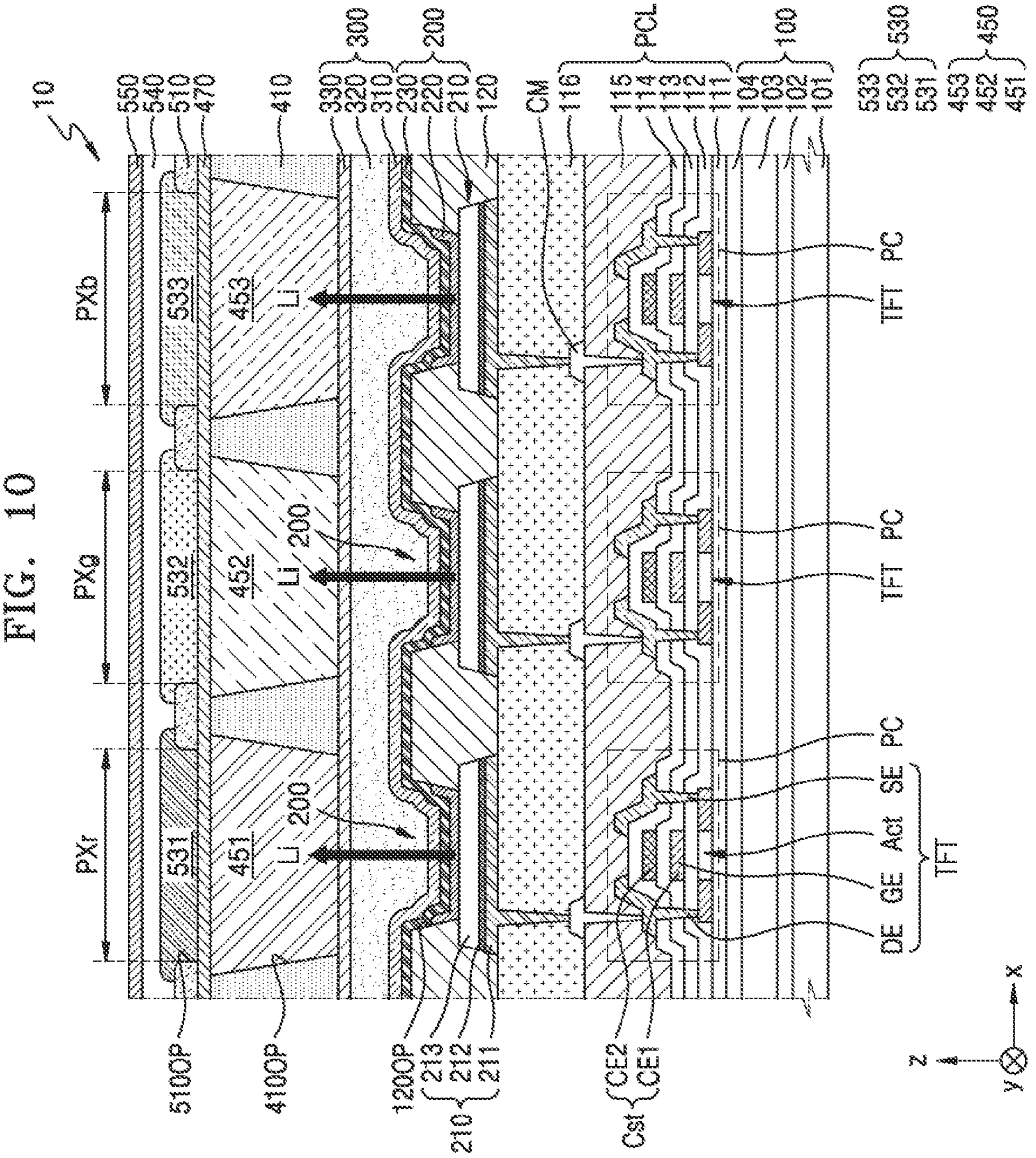
FIG. 10 is a cross-sectional view of a portion of a display panel of a display apparatus according to another embodiment.

FIG. 10 is a cross-sectional view of a portion of the display panel 10 of the display apparatus 1 according to another embodiment. Because the same reference numerals are given to the same elements as those described above with reference to FIG. 4, detailed descriptions thereof are omitted.

Referring to FIG. 10, the intermediate layer 220 of each light-emitting element 200 may include an emission layer that emits incident light Li having a first color. That is, the display panel 10 of the display apparatus 1 (see FIG. 2) may include the plurality of light-emitting elements 200 each emitting incident light Li having the first color. As an example, incident light Li having the first color may be blue light in a wavelength band greater than and equal to 400 nm, and less than and equal to 495 nm.

According to an embodiment, the display panel 10 may further include a color-converting light-transmitting layer 450 configured to pass therethrough the incident light Li of the first color from the light-emitting element 200 without color conversion or to convert the incident light Li of the first color into light of a second color or light of a third color which has wavelength band different from the incident light Li of the first color.

As an example, the color-converting light-transmitting layer 450 may include a first color-converting layer 451, a second color-converting layer 452, and a light-transmitting layer 453. The first color-converting layer 451 may convert incident light Li of the first color emitted from the light-emitting element 200 into light of the second color, and the second color-converting layer 452 may convert incident light Li of the first color emitted from another light-emitting element 200 into light of the third color. The light-transmitting layer 453 may pass therethrough the incident light Li of the first color emitted from another light-emitting element 200 without color conversion. Here, the light of the second color may be red light in a wavelength band greater than and equal to 580 nm and less than and equal to 750 nm, and the light of the third color may be green light in a wavelength band greater than and equal to 495 nm and less than and equal to 580 nm.

In an embodiment, the color-converting light-transmitting layer 450 may be formed on the upper surface of the thin-film encapsulation layer 300 and arranged over the opposite electrode 230. In another embodiment, the color-converting light-transmitting layer 450 may be formed on a separate substrate and then the separate substrate may be adhered to the upper surface of the thin-film encapsulation layer 300. Even in this case, the color-converting light-transmitting layer 450 may be arranged over the opposite electrode 230.

The first color-converting layer 451, the second color-converting layer 452, and the light-transmitting layer 453 of the color-converting light-transmitting layer 450 may be arranged inside an opening 410OP of a light-blocking wall portion 410. The light-blocking wall portion 410 may be arranged on the thin-film encapsulation layer 300 and may overlap the pixel-defining layer 120. The opening 410OP of the light-blocking wall portion 410 may be disposed corresponding to the opening 120OP of the pixel-defining layer 120 in a plan view.

The light-blocking wall portion 410 may have various colors including black, white, red, violet, blue, and the like. The light-blocking wall portion 410 may include colored pigment or dye. The light-blocking wall portion 410 may include a light-blocking material. The light-blocking material may include an opaque inorganic insulating material including metal oxide such as titanium oxide ($TiO_2$), chrome oxide ($Cr_2O_3$), or molybdenum oxide ($MoO_3$), or an opaque organic insulating material such as a black resin and the like. As another example, the light-blocking wall portion 410 may include an organic insulating material such as a white resin and the like.

The light-blocking wall portion 410 may prevent color mixing between light converted or transmitted in the first color-converting layer 451, the second color-converting layer 452, and the light-transmitting layer 453.

A first capping layer 470 may be arranged on the color-converting light-transmitting layer 450. The first capping layer 470 may cover the color-converting light-transmitting layer 450. The first capping layer 470 may protect the upper portion of the color-converting light-transmitting layer 450. The first capping layer 470 may include an inorganic insulating material including, for example, silicon nitride, silicon oxide, or silicon oxynitride.

The color-converting light-transmitting layer 450 may include quantum dots as described below with reference to FIG. 11. Because quantum dots include nano particles, the quantum dots may be deteriorated by reacting with moisture, oxygen and the like. Accordingly, the first capping layer 470 may cover the color-converting light-transmitting layer 450 in the upper portion of the color-converting light-transmitting layer 450 such that moisture, oxygen, and the like are not introduced into the quantum dots inside the color-converting light-transmitting layer 450.

A light-blocking layer 510 may be arranged on the first capping layer 470. The light-blocking layer 510 may include an opening 510OP disposed corresponding to the opening 410OP of the light-blocking wall portion 410. The light-blocking layer 510 may include a light-blocking material. The light-blocking material may include an opaque inorganic insulating material including metal oxide such as titanium oxide ($TiO_2$), chrome oxide ($Cr_2O_3$), or molybdenum oxide ($MoO_3$), or an opaque organic insulating material such as a black resin and the like. The light-blocking layer

510 may prevent light leakage from occurring in the display panel 10 by blocking light emitted to the outside through regions except the emission area.

According to an embodiment, the display panel 10 of the display apparatus 1 may further include a color filter layer 530. The color filter layer 530 may be arranged on the first capping layer 470 and may overlap the color-converting light-transmitting layer 450. The color filter layer 530 may be arranged inside the opening 510OP of the light-blocking layer 510. In an embodiment, a portion of the color filter layer 530 may be arranged on the light-blocking layer 510.

In an embodiment, the color filter layer 530 may include a first color filter layer 531, a second color filter layer 532, and a third color filter layer 533 respectively disposed in an areas corresponding to the first color-converting layer 451, the second color-converting layer 452, and the light-transmitting layer 453 of the color-converting light-transmitting layer 450. The first to third color filter layers 531, 532, and 533 may be organic material patterns including dye or pigment. The first to third color filter layers 531, 532, and 533 may include pigment or dye of different colors to selectively pass therethrough colors of light corresponding to the first to third color filter layers 531, 532, and 533, respectively. As an example, the first color filter layer 531 may include red pigment or dye to selectively pass through red light. The second color filter layer 532 may include green pigment or dye to selectively pass through green light. The third color filter layer 533 may include blue pigment or dye to selectively pass through blue light.

In an embodiment, though not shown, when taking into account the amount of light emission of light of each color emitted from the display panel 10, the thickness of the third color filter layer 533 may be greater than the thicknesses of the first color filter layer 531 and the second color filter layer 532.

As an additional example, the light-blocking layer 510 may include the same material as that of the third color filter layer 533 and be formed during the same process as a process of forming the third color filter layer 533. The light-blocking layer 510 does not include the opening 510OP in a position corresponding to the light-transmitting layer 453. A portion of the light-blocking layer 510 may serve as the third color filter layer 533.

Incident light Li of the first color may be color-converted through the color-converting light-transmitting layer 450, or may pass through the color-converting light-transmitting layer 450 and then progress to the color filter layer 530. As an example, incident light Li may be converted to red light through the first color-converting layer 451 and then may progress to the first color filter layer 531. Another incident light Li may be converted to green light through the second color-converting layer 452 and then may progress to the second color filter layer 532. Another incident light Li may pass through the light-transmitting layer 453 without color conversion and then progress to the third color filter layer 533. Light passing through the first to third color filter layers 531, 532, and 533 may be emitted to the outside. Color images are displayed by red light, blue light, and green light emitted to the outside. An emission area from which red light is emitted may be defined as a red sub-pixel PXr, an emission area from which green light is emitted may be defined as a green sub-pixel PXg, and an emission area from which blue light is emitted may be defined as a blue sub-pixel PXb.

A filling material 540 may be arranged on the light-blocking layer 510 and may cover the color filter layer 530. The filling material 540 may act as a buffer against external pressure and the like and provide a flat surface on the upper surface of the light-blocking layer 510. The filling material 540 may include an organic material such as an acryl-based resin, an epoxy-based resin, polyimide, and polyethylene.

A second capping layer 550 may be arranged on the filling material 540. The second capping layer 550 may include the same material as that of the first capping layer 470 and include an inorganic insulating material, for example, silicon nitride, silicon oxide, or silicon oxynitride.

Figure 11:
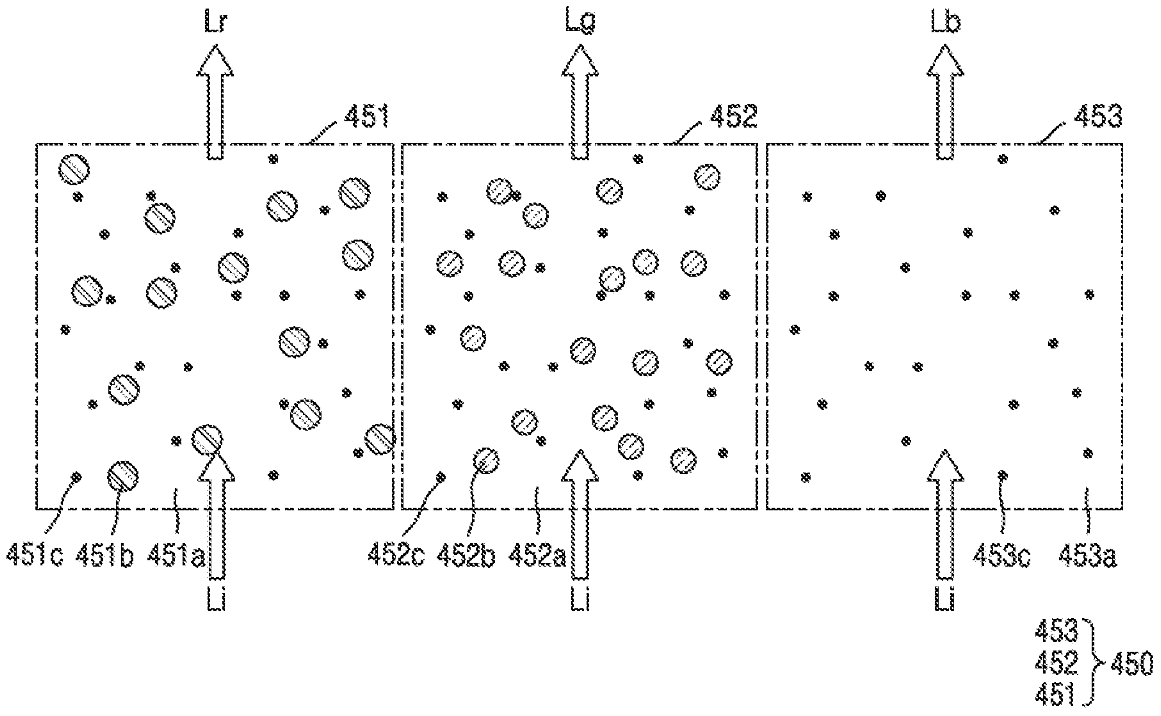
FIG. 11 is a cross-sectional view of a portion of a color-converting light-transmitting layer of a display panel of FIG. 10.

FIG. 11 is a cross-sectional view of a portion of a color-converting light-transmitting layer of a display panel of FIG. 10.

Referring to FIG. 11, the color-converting light-transmitting layer 450 may include the first color-converting layer 451, the second color-converting layer 452, and the light-transmitting layer 453. Incident light Li of the first color, for example, blue incident light Li emitted from the light-emitting element 200 (see FIG. 10) may be incident to the first color-converting layer 451, the second color-converting layer 452, and the light-transmitting layer 453.

As an example, the first color-converting layer 451 may convert blue incident light Li to red light Lr. For this purpose, the first color-converting layer 451 may include a first photosensitive polymer 451*a* in which first quantum dots 451*b* are dispersed.

The first photosensitive polymer 451*a* is not particularly limited as long as it is a material having excellent dispersion characteristics and light transmission characteristics. As an example, the first photosensitive polymer 451*a* may include an acryl-based resin, an imide-based resin, or an epoxy-based resin.

The first quantum dots 451*b* may be excited by blue incident light Li and may emit red light Lr isotropically. The red light Lr may have a wavelength longer than that of blue light. In the present specification, quantum dots denote crystals of a semiconductor compound and may include an arbitrary material that may emit light in various wavelengths depending on the size of crystals thereof.

The first quantum dots 451*b* may be synthesized by a wet chemical process, a metal organic chemical deposition vapor deposition (MOCVD) process, a molecular beam epitaxy (MBE) process, or a similar process. The wet chemical process is a method of mixing an organic solvent and a precursor material and then growing quantum dot particles. Because, when the crystals grow, the organic solvent naturally serves as a dispersant coordinated on the surface of the quantum dot crystal and adjusts the growing of the crystals, the wet chemical process may control the growing of the quantum dot particles through an easier process of low costs than vapor depositions such as metal organic chemical vapor deposition (MOCVD) or molecular beam epitaxy (MBE).

The first quantum dots 451*b* may include a group III-VI semiconductor compound; a group II-VI semiconductor compound; a group III-V semiconductor compound; a group III-VI semiconductor compound; a group I-III-VI semiconductor compound; a group IV-VI semiconductor compound; a group IV element or compound; or an arbitrary combination thereof.

Examples of a group III-VI semiconductor compound may include a two-element compound such as $In_2S_3$; a three-element compound including AgInS, $AgInS_2$, CuInS, and $CuInS_2$; or an arbitrary combination thereof.

Examples of a group II-VI semiconductor compound may include one of a two-element compound including CdS, CdSe, CdTe, ZnS, ZnSe, ZnTe, ZnO, HgS, HgSe, HgTe, MgSe, and MgS; a three-element compound including CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, and MgZnS; and a four-element compound including CdZnSeS, CdZnSeTe, CdZnSTe, CdHgSeS, CdHgSeTe, CdHgSTe, HgZnSeS, HgZnSeTe, and HgZnSTe; or an arbitrary combination thereof.

Examples of a group III-V semiconductor compound may include a two-element compound including GaN, GaP, GaAs, GaSb, AlN, AlP, AlAs, AlSb, InN, InP, InAs, and InSb; a three-element compound including GaNP, GaNAs, GaNSb, GaPAs, GaPSb, AlNP, AlNAs, AlNSb, AlPAs, AlPSb, InGaP, InNP, InAlP, InNAs, InNSb, InPAs, InPSb, and GaAlNP; a four-element compound including GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, and InAlPSb; or an arbitrary combination thereof. The group III-V semiconductor compound may further include a group II element. Examples of the group III-V semiconductor compound including the group II element may include InZnP, InGaZnP, and InAlZnP.

Examples of the group III-VI semiconductor compound may include a two-element compound including GaS, GaSe, $Ga_2Se_3$, GaTe, InS, InSe, $In_2Se_3$, and InTe; a three-element compound including $InGaS_3$, and $InGaSe_3$; or an arbitrary combination thereof.

Examples of the group I-III-VI semiconductor compound may include a three-element compound including AgInS, $AgInS_2$, CuInS, $CuInS_2$, $CuGaO_2$, $AgGaO_2$, and $AgAlO_2$; or an arbitrary combination thereof.

Examples of the group IV-VI semiconductor compound may include a two-element compound including SnS, SnSe, SnTe, PbS, PbSe, and PbTe; a three-element compound including SnSeS, SnSeTe, SnSTe, PbSeS, PbSeTe, PbSTe, SnPbS, SnPbSe, and SnPbTe; a four-element compound including SnPbSSe, SnPbSeTe, and SnPbSTe; or an arbitrary combination thereof.

The group IV element or compound may include a single element compound including Si and Ge; a two-element compound including SiC and SiGe; or an arbitrary combination thereof.

Each element included in a multi-element compound such as the two-element compound, the three-element compound, or the four-element compound may be present inside a particle at a uniform concentration or a non-uniform concentration.

The first quantum dots 451*b* may have a single structure in which the concentration of each element included in the relevant quantum dot is uniform, or a double structure of a core-shell. As an example, a material included in the core may be different from a material include in the shell.

The shell may serve as a protective layer that prevents a chemical change of the core to maintain a semiconductor characteristic and/or serve as a charging layer for giving an electrophoretic characteristic to the quantum dot. The shell may include a single layer or a multi-layer. An interface between the core and the shell may have a concentration gradient in which the concentration of an element existing in the shell reduces toward the center.

Examples of the shell may include oxide of metal or non-metal, a semiconductor compound, or a combination thereof. Examples of the oxide of metal or non-metal may include a two-element compounding including $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, and NiO; or a three-element compound including $MgAl_2O_4$, $CoFe_2O_4$, $NiFe_2O_4$, and $CoMn_2O_4$; or an arbitrary combination thereof. Examples of the semiconductor compound may include the group III-VI semiconductor compound; the group II-VI semiconductor compound; the group III-V semiconductor compound; the group I-III-VI semiconductor compound; the group IV-VI semiconductor compound; or an arbitrary combination thereof as described in the present specification. As an example, the semiconductor compound may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or an arbitrary combination thereof.

The first quantum dots 451*b* may have a full width of half maximum (FWHM) of a light emission wavelength spectrum of 45 nm or less, preferably about 40 nm or less, and more preferably about 30 nm or less. Within this range, color purity or color reproduction may be improved. In addition, because light emitted from the first quantum dots 451*b* is emitted in all directions, a viewing angle of light may be improved.

In addition, specifically, the shape of the first quantum dots 451*b* may include a spherical shape, a pyramid shape, a multi-arm shape, or a cubic nano particle, a nano tube, a nano wire, a nano fiber, and a nano plate particle in an embodiment. First scattering particles 451*c* may be further dispersed inside the first photosensitive polymer 451*a*. The first scattering particles 451*c* may improve the color-conversion efficiency of the first color-converting layer 451 by scattering blue incident light Li not absorbed in the first quantum dots 451*b* and allowing more first quantum dots 451*b* to be excited. In addition, the first scattering particles 451*c* may scatter light in various directions regardless of incident angles while substantially not converting the wavelength of incident light. Through this, lateral visibility may be improved.

The first scattering particles 451*c* may be particles, for example, light scattering particles having a refractive index different from that of the first photosensitive polymer 451*a*. The first scattering particles 451*c* are not particularly limited as long as they may form an optical interface with the first photosensitive polymer 451*a* and partially scatter transmitted light. As an example, the first scattering particles 451*c* may be metal oxide particles or organic particles. Examples of the metal oxides may include titanium oxide ($TiO_2$), zirconium oxide ($ZrO_2$), aluminum oxide ($Al_2O_3$), indium oxide ($In_2O_3$), zinc oxide (ZnO), or tin oxide ($SnO_2$). Examples of the organic material may include an acryl-based resin or a urethane-based resin.

The second color-converting layer 452 may convert blue incident light Li to green light Lg. The second color-converting layer 452 may include a second photosensitive polymer 452*a* in which second quantum dots 452*b* are dispersed. Because second scattering particles 452*c* are dispersed together with the second quantum dots 452*b* inside the second photosensitive polymer 452*a*, the color-conversion rate of the second color-converting layer 452 may be increased.

The second photosensitive polymer 452*a* may include the same material as that of the first photosensitive polymer 451*a*, and the second scattering particles 452*c* may include the same material as that of the first scattering particles 451*c*.

The second quantum dots 452*b* may include the same material as that of the first quantum dots 451*b* and have the same shape as that of the first quantum dots 451*b*. However, the size of the second quantum dots 452*b* may be less than the size of the first quantum dots 451*b* for the second quantum dots 452*b* to emit light in a wavelength band different from the wavelength band of the first quantum dots 451*b*. Specifically, an energy band gap may be adjusted by adjusting the size of the quantum dots, and thus, light in various wavelength bands may be obtained. The second quantum dots 452*b* have a size less than that of the first quantum dots 451*b*. With this configuration, the second quantum dots 452*b* may be excited by blue incident light Li and may emit green light Lg isotropically. The green light may have a longer wavelength than that of the blue incident light Li and a shorter wavelength than that of the red light Lr.

The light-transmitting layer 453 may include a third photosensitive polymer 453*a* in which third scattering particles 453*c* are dispersed. That is, the light-transmitting layer 453 does not include quantum dots that may be excited by blue incident light Li. Like the first photosensitive polymer 451*a*, the third photosensitive polymer 453*a* may include an organic material having a light transmission characteristic. The third scattering particles 453*c* may include the same material as that of the first scattering particles 451*c*. Accordingly, because blue incident light Li incident to the light-transmitting layer 453 may pass through the light-transmitting layer 453 without color conversion, Light emitted through the light-transmitting layer 453 may be blue light Lb. Blue light Lb may be scattered by the third scattering particles 453*c* inside the light-transmitting layer 453 and emitted to the outside. Because the light-transmitting layer 453 has blue incident light Li pass through without color conversion, a higher light efficiency may be obtained.

According to an embodiment, elution of a preset metal from the pixel electrode may be prevented, and thus, a display apparatus with a reduced defect rate of a light-emitting element and a method of manufacturing the display apparatus may be implemented. However, the scope of the present disclosure is not limited by this effect.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope as defined by the following claims.

What is claimed is:

1. A method of manufacturing a display apparatus, the method comprising:

forming a pixel electrode over a substrate;

forming an intermediate layer on the pixel electrode; and forming an opposite electrode covering the intermediate layer, wherein the forming of the pixel electrode includes:

forming a preliminary reflective layer including a first metal;

forming a metal thin film on the preliminary reflective layer, the metal thin film including a second metal different from the first metal;

forming a preliminary transparent layer on the metal thin film;

patterning the preliminary reflective layer, the metal thin film, and the preliminary transparent layer;

forming a preliminary pixel-defining layer on the preliminary transparent layer that is patterned;

forming a pixel-defining layer by patterning the preliminary pixel-defining layer; and heat-treating the pixel-defining layer, wherein the pixel-defining layer includes an organic insulating material, wherein the heat-treating the pixel-defining layer hardens the organic insulating material of the pixel-defining layer, and wherein the heat-treating the pixel-defining layer includes forming a barrier layer by oxidizing at least a portion of the metal thin film through the heat-treating.

2. The method of claim 1, wherein the first metal of the preliminary reflective layer includes aluminum or an aluminum alloy.

3. The method of claim 1, wherein the second metal of the metal thin film includes titanium.

4. The method of claim 1, wherein the preliminary reflective layer has a thickness of about 500 Å to about 5000 Å.

5. The method of claim 1, wherein the barrier layer has a thickness of about 5 Å to about 100 Å.

* * * * *